(12) United States Patent
Tanioka et al.

(10) Patent No.: US 7,852,101 B2
(45) Date of Patent: Dec. 14, 2010

(54) SEMICONDUCTOR DEVICE TESTING APPARATUS AND POWER SUPPLY UNIT FOR SEMICONDUCTOR DEVICE TESTING APPARATUS

(75) Inventors: Michinobu Tanioka, Tokyo (JP); Shigeki Hoshino, Tokyo (JP); Toru Taura, Tokyo (JP)

(73) Assignee: NEC Corporation, Tokyo (JP)

( * ) Notice: Subject to any disclaimer, the term of this patent is extended or adjusted under 35 U.S.C. 154(b) by 156 days.

(21) Appl. No.: 12/066,009

(22) PCT Filed: Jul. 19, 2006

(86) PCT No.: PCT/JP2006/314292

§ 371 (c)(1),
(2), (4) Date: Jun. 24, 2008

(87) PCT Pub. No.: WO2007/029422

PCT Pub. Date: Mar. 15, 2007

(65) Prior Publication Data

US 2008/0265933 A1    Oct. 30, 2008

(30) Foreign Application Priority Data

Sep. 7, 2005   (JP) .............................. 2005-259061

(51) Int. Cl.
*G01R 31/26* (2006.01)
(52) U.S. Cl. .................. 324/765; 324/754; 324/761
(58) Field of Classification Search .................. None
See application file for complete search history.

(56) References Cited

U.S. PATENT DOCUMENTS

| 5,969,533 | A | 10/1999 | Takagi |
| 6,215,321 | B1 * | 4/2001 | Nakata ........................ 324/754 |
| 6,414,501 | B2 * | 7/2002 | Kim et al. .................... 324/754 |
| 6,651,325 | B2 * | 11/2003 | Lee et al. ...................... 29/846 |
| 7,084,657 | B2 * | 8/2006 | Matsumura ................. 324/762 |

FOREIGN PATENT DOCUMENTS

| JP | 5-198636 A | 8/1993 |
| JP | 5-226430 A | 9/1993 |
| JP | 5-243344 A | 9/1993 |
| JP | 6-148584 A | 5/1994 |
| JP | 406174749 A * | 6/1994 |

(Continued)

*Primary Examiner*—Vinh P Nguyen
(74) *Attorney, Agent, or Firm*—Sughrue Mion, PLLC

(57) ABSTRACT

The semiconductor device testing apparatus has a testing LSI; a power supply unit; and an intermediate substrate. The testing LSI has a dielectric material layer facing a tested semiconductor device; an electrode disposed in a position corresponding to a position of an external terminal electrode of the tested device on a surface of the dielectric layer facing the tested device; and a first penetrating electrode that passes completely through the dielectric layer, is connected to the electrode, and is used for exchanging signals with the exterior. The power supply unit has mutually independent elastic probe pins that are disposed in positions corresponding to power electrodes of the tested device, and that are provided with a metal protrusion at the distal ends thereof; a substrate on which a first wiring layer is formed and is electrically connected to the probe pins; and a second penetrating electrode that passes through the substrate.

15 Claims, 21 Drawing Sheets

FOREIGN PATENT DOCUMENTS

| | | |
|---|---|---|
| JP | 6-324081 A | 11/1994 |
| JP | 6-331655 A | 12/1994 |
| JP | 6-334005 A | 12/1994 |
| JP | 6-334006 A | 12/1994 |
| JP | 9-281144 A | 10/1997 |
| JP | 10-38918 A | 2/1998 |
| JP | 11-190748 A | 7/1999 |
| JP | 2001-91543 A | 4/2001 |
| JP | 2002-134570 A | 5/2002 |
| JP | 2002-176082 A | 6/2002 |
| JP | 2002-257859 A | 9/2002 |
| JP | 2003-57266 A | 2/2003 |
| JP | 2003-185676 A | 7/2003 |
| JP | 2003-273180 A | 9/2003 |
| JP | 2003-344448 A | 12/2003 |
| WO | 98/58266 A | 12/1998 |

* cited by examiner

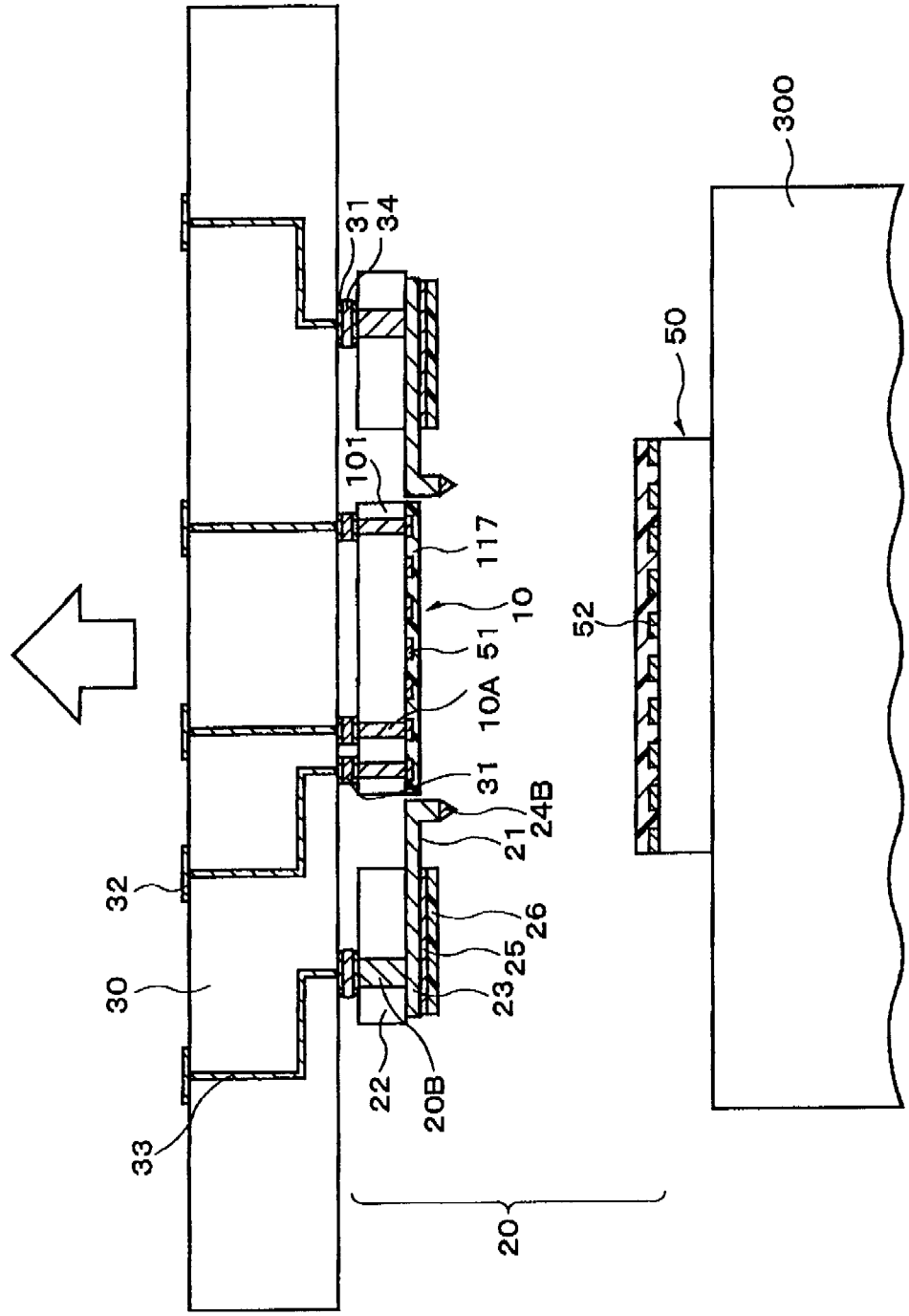

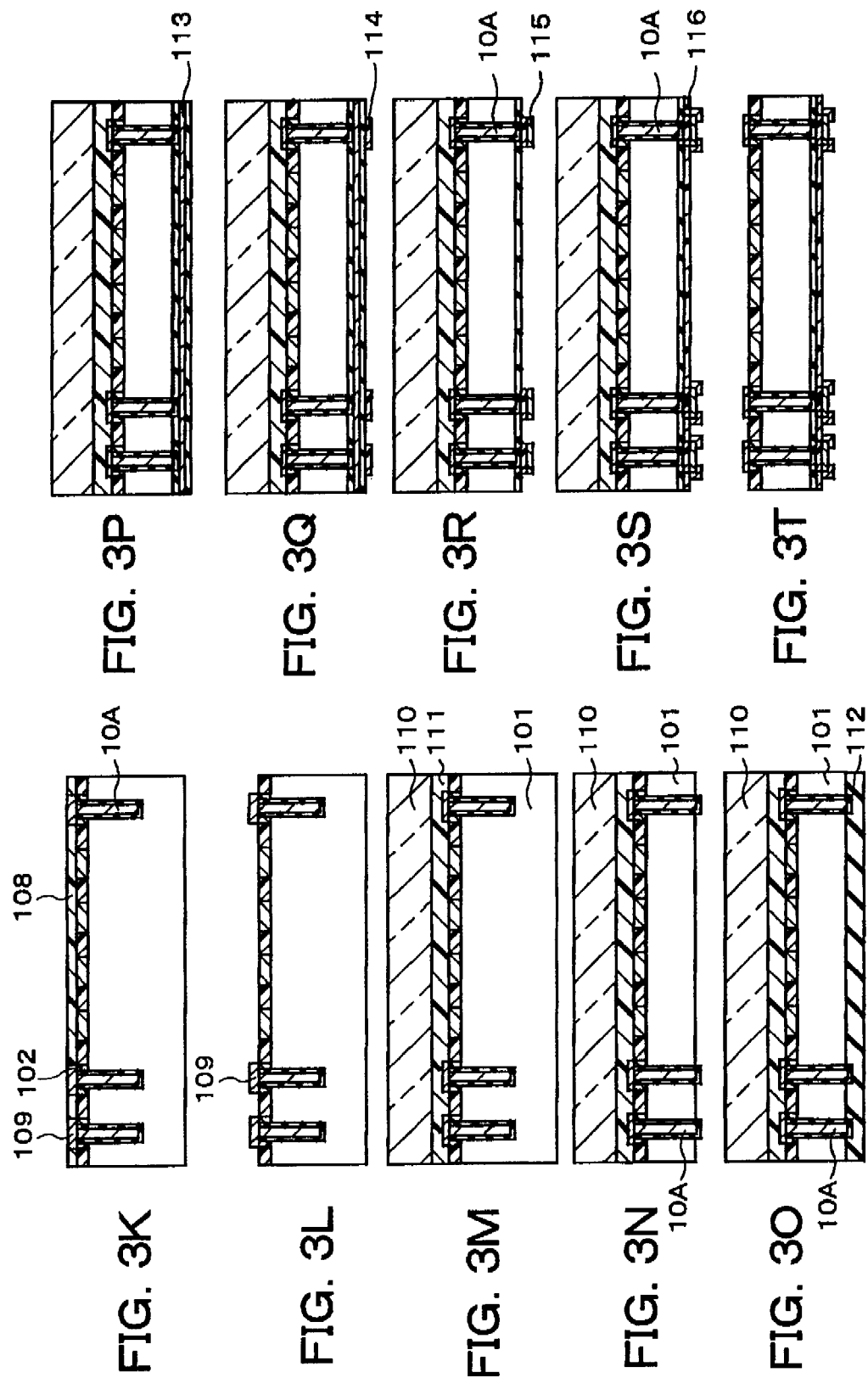

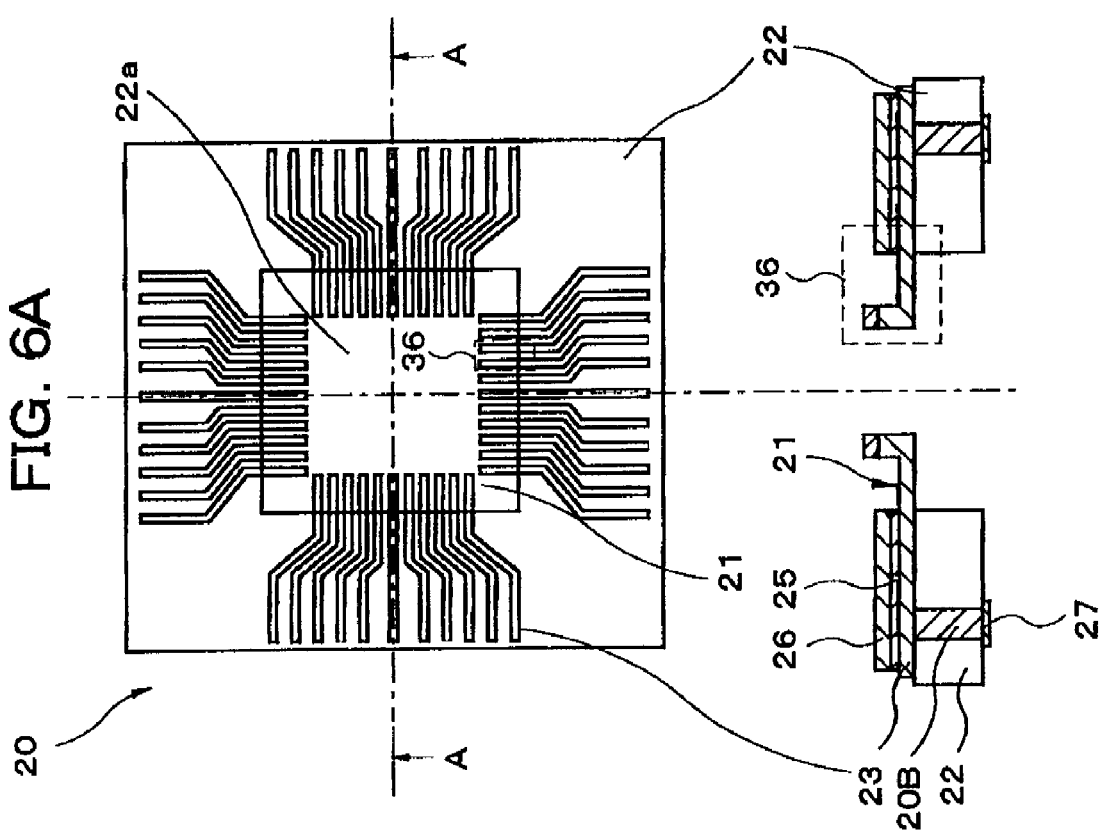

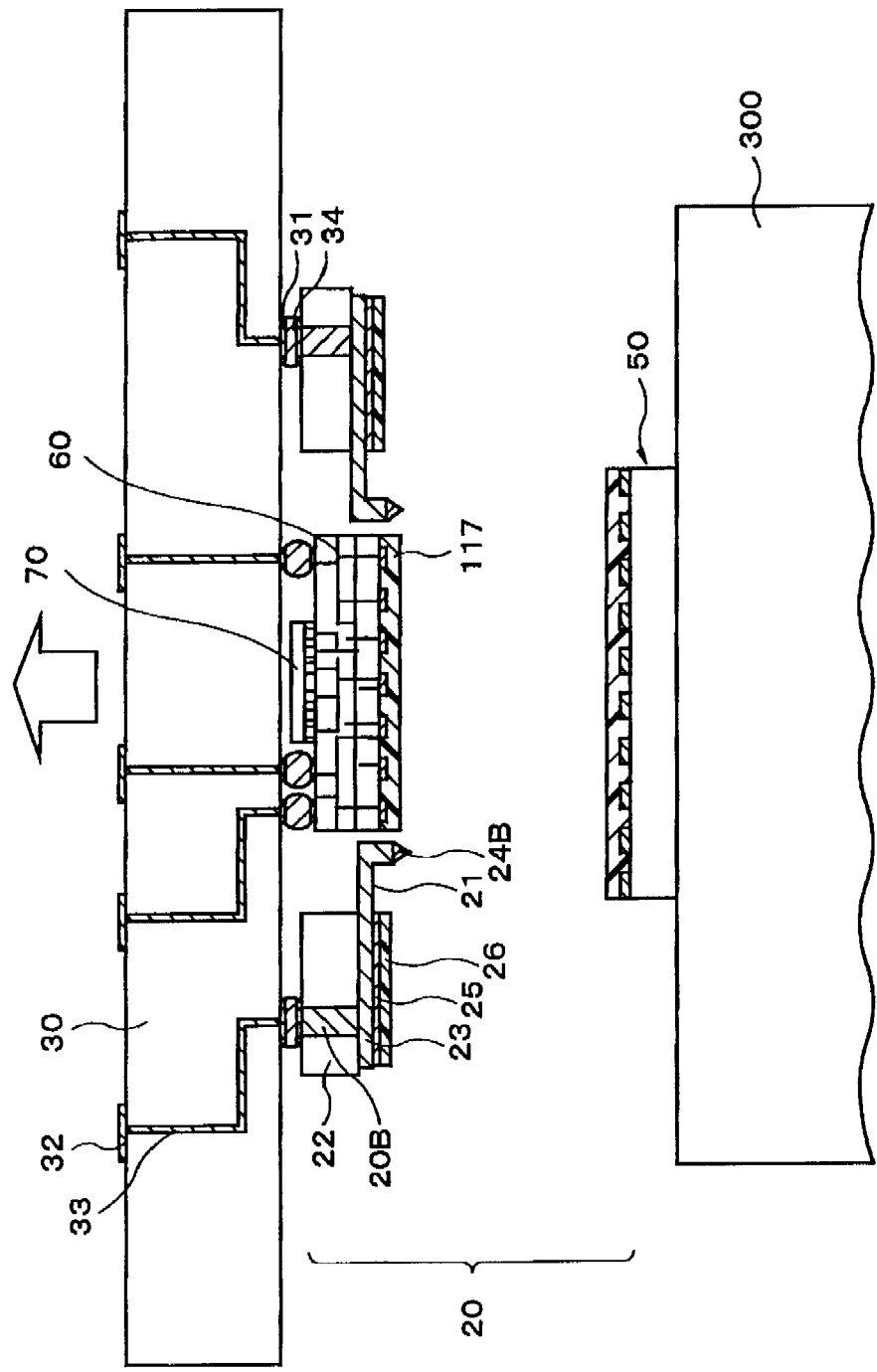

FIG. 16

| Year of Production | 2003 | 2004 | 2005 | 2006 | 2007 | 2008 | 2009 | 2010 | 2012 | 2013 | 2015 | 2016 | 2018 |
|---|---|---|---|---|---|---|---|---|---|---|---|---|---|
| Technology Node | | hp90 | | | hp65 | | | hp45 | | hp32 | | hp22 | |
| DRAM 1/2 Pitch (nm) | 100 | 90 | 80 | 70 | 65 | 57 | 50 | 45 | 35 | 32 | 25 | 22 | 18 |
| MPU/ASIC 1/2 Pitch (nm) | 107 | 90 | 80 | 70 | 65 | 57 | 50 | 45 | 35 | 32 | 25 | 22 | 18 |
| MPU Printed Gate Length (nm) | 65 | 53 | 45 | 40 | 35 | 32 | 28 | 25 | 20 | 18 | 14 | 13 | 10 |
| MPU Physical Gate Length (nm) | 45 | 37 | 32 | 28 | 25 | 22 | 20 | 18 | 14 | 13 | 10 | 9 | 7 |
| Chip Interconnect Pitch (μm) | | | | | | | | | | | | | |
| Wire bond-ball | 40 | 35 | 30 | 25 | 25 | 20 | 20 | 20 | 20 | 20 | 20 | 20 | 20 |
| Wire bond-wedge | 30 | 25 | 20 | 20 | 20 | 20 | 20 | 20 | 20 | 20 | 20 | 20 | 20 |
| TAB* | 35 | 35 | 30 | 30 | 25 | 25 | 25 | 20 | 20 | 20 | 15 | 15 | 15 |
| Flip chip area array* | 150 | 150 | 130 | 130 | 120 | 110 | 100 | | 90 | | 80 | | 70 |
| Peripheral flip chip | 60 | 60 | 40 | 40 | 30 | 30 | 20 | 20 | 20 | 20 | 15 | 15 | 15 |

INTERNATIONAL TECHNOLOGY ROADMAP FOR SEMICONDUCTORS (ITRS 2003)

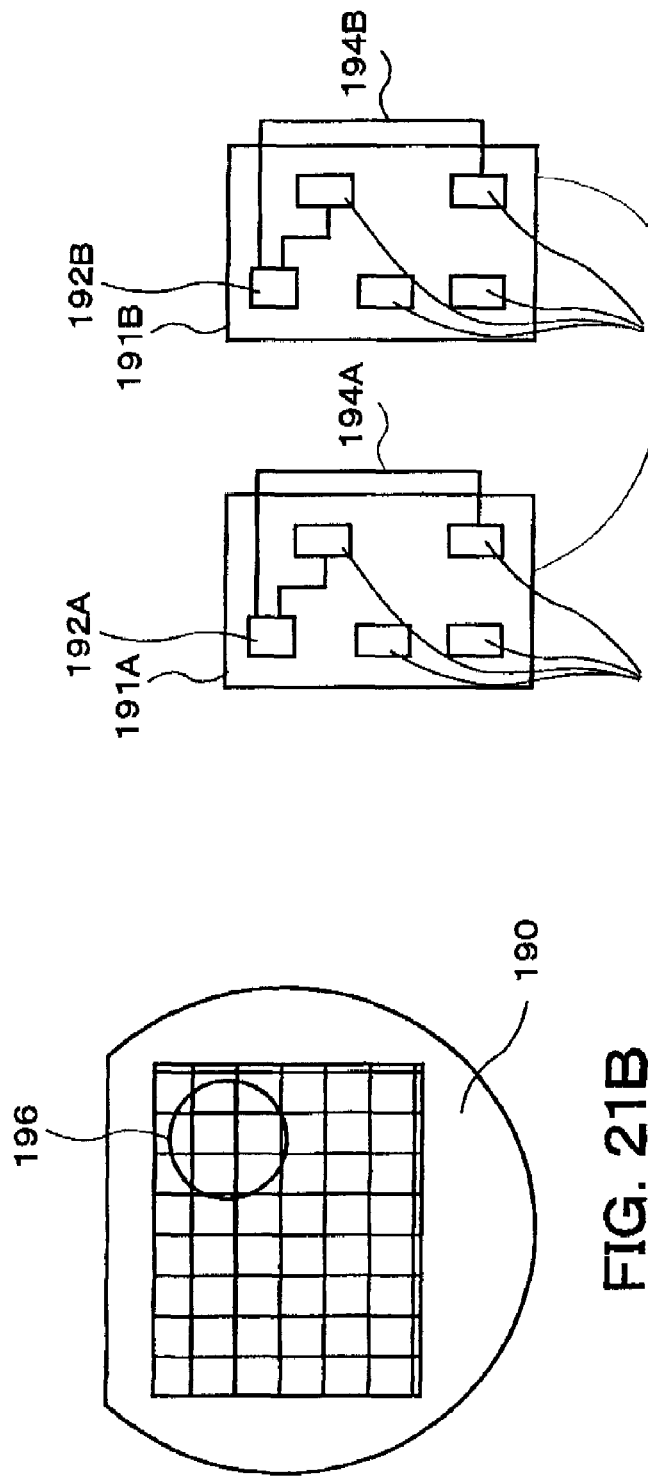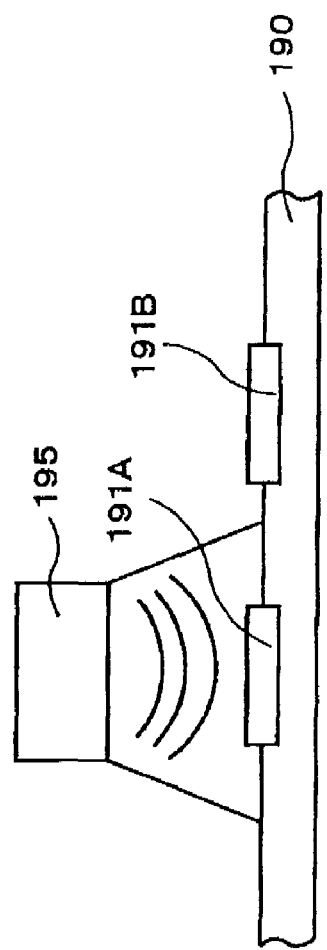

PAD PITCH: LARGE → SMALL

ACTUAL JOINING
SURFACE AREA: LARGE → SMALL

SEMICONDUCTOR DEVICE TESTING APPARATUS AND POWER SUPPLY UNIT FOR SEMICONDUCTOR DEVICE TESTING APPARATUS

TECHNICAL FIELD

The present invention relates to a testing apparatus for testing a semiconductor device in a wafer state, more particularly relates to a testing apparatus that is suitable for testing semiconductor devices in which the electrode pitch of the semiconductor device is narrow and a high-speed high-capacity transfer is required, and also relates to a power supply unit used therein.

BACKGROUND ART

In recent times, there is a rapidly increasing demand for semiconductor devices that have higher density, higher speed, and higher capacity transmission. Particularly from the viewpoint of downscaling of semiconductor devices, rapid progress in downscaling is predicted (FIG. 14) in the 2003 Edition of the ITRS (International Technology Roadmap for Semiconductors) roadmap, i.e., that the pitch of peripherally disposed electrodes will be reduced from 35 µm in 2004 to 20 µm in 2009, and that the pitch of area disposed electrodes with be reduced from 150 µm in 2004 to 100 µm in 2009. In such conditions, semiconductor device testing techniques having a very small pitch has been one key technology. In semiconductor device manufacturing in particular, the problem that involves the manner in which elements are electrically tested in the wafer state, i.e., the manner in which wafer testing is carried out, is very critical in terms of contributing to improvements in quality via rapid feedback of problems in the wafer manufacturing process, reliably removing defective products and increasing the production yield rate during mass production of semiconductor devices, and ensuring lower costs by achieving higher productivity.

Conventional wafer testing is largely classified into contact schemes and non-contact schemes in terms of sending and receiving signals. Currently, contact schemes that are mainly used are those in which some type of contact terminal is brought into contact with the electrodes of a semiconductor device by using a probe card as an interface for sending and receiving signals between a wafer and a tester. The most commonly used contact terminal is a probe card referred to as a cantilever, and is a scheme for bringing metal needles into contact with the electrodes of the semiconductor device. Other contact schemes include those that use a membrane sheet having metal protrusions (bumps), those that use a membrane sheet having TCP (Tape Carrier Package) leads, and those that use a pin-shaped silicon probe in which a plated silicon whisker is used.

Known non-contact schemes include schemes in which a coil for communication is disposed in a semiconductor apparatus and signal input/output is wirelessly carried out with the exterior; schemes in which a chip having a structure that mirrors that of a semiconductor device is used to bring the signal wiring of a semiconductor apparatus and the wiring of the mirror chip into close proximity with each other, whereby signals are brought out by non-contact capacitive coupling; and the like. Patent document 1 discloses a cantilever scheme that uses metal needles, patent document 2 discloses a membrane sheet having metal protrusions, patent document 3 discloses a membrane sheet having TCP leads, and patent document 4 discloses the use of a silicon whisker. Patent document 5 discloses a scheme for using a coil for communication, and patent document 6 discloses a scheme for bringing out signals by way of non-contact capacitive coupling. First, the prior arts of contact schemes are described below.

(1) Cantilever Scheme Using Metal Needles (Patent Document 1) (First Prior Art)

This scheme involves machining tungsten, rhenium tungsten, and other metal needles and using the needles as contact terminals. The distal ends of metal needles 150 having a base diameter of 190 µm are machined to ultra fine wires in the manner shown in FIG. 17 in order to provide the metal needles with a narrow pitch. The plurality of machined metal needles 150 is provided with insulation therebetween by using a shielding plate 151, and is stacked in four tiers. Such a structure allows the pitch of the distal ends of the contact terminals to be narrowed to a pitch of 50 µm.

(2) Scheme for Using a Membrane Sheet Having Metal Protrusions (Bumps) (Patent Document 2) (Second Prior Art)

The "thin film probe cushioning system having bump contacts" of patent document 7 and the "probe card" of patent document 8 are known in addition to patent document 2. These prior arts are probe structures that use a contact sheet having metal protrusions (bumps) in positions that face the external electrodes of a semiconductor device. FIG. 18 shows a typical example of a portion of a probe card structure, and a scheme for manufacturing the same described in patent document 2.

In FIG. 18, a desired test circuit pattern (not shown) and an electrode lead 161 are formed on one surface of a flexible insulation film 160 that constitutes the probe card. A metal protrusion (bump) 162 is formed at the distal end of the electrode lead 161 in a position that faces external terminal electrodes 166 of a semiconductor device 165. The probe card makes contact with the external terminal electrodes 166 of the semiconductor device 165 by way of the metal protrusion 162.

(3) Scheme for Using a Membrane Sheet Having TCP Projections (Patent Document 3) (Third Prior Art)

Prior arts similar to patent document 3 are disclosed in patent documents 9, 10, and 11. These prior arts have a probe structure in which a flexible substrate having metal leads is used in a position that faces the external electrodes of a semiconductor device.

FIG. 19 shows a structural diagram of the probe card disclosed in patent document 3 as a typical example. FIG. 19(*a*) is a cross-sectional view of the essential parts on one side of the probe card, and FIG. 19(*b*) is a perspective cutaway view showing a portion of the probe card. A desired testing circuit pattern (not shown) and a probe pin 172 are formed on one side of a flexible film 171. The probe pin 172 makes contact with the external electrode of a semiconductor device 175.

The probe pin 172 is disposed at a distal end portion of the testing circuit pattern, and the wiring pattern of the probe pin is supported by the film 171. The wiring pattern, probe pin 172, and film 171 constitute as a whole a flexible substrate (FPC) 170. The flexible substrate 170 is thin and therefore cannot achieve a desired contact force by itself. For this reason, the probe card is provided with dampers 173*a* and 173*b* and a support body 174 that support the flexible substrate 170 on both surfaces thereof. The probe pin 172 is thereby configured to reliably make contact with an external electrode of the semiconductor device 175.

The support body 174 is made of stainless steel or brass. The support body 174 has a sloped surface in the front (right side in FIG. 19(*a*)) that receives the portion of the flexible substrate 170 proximate to the probe pin 172, and has a horizontal mounting surface in the rear (left side in FIG. 19(*a*)) on the card substrate (not shown). The sloped surface is a trapezoidal shape in which the front end portion is a short side as viewed from above in the manner shown in FIG. 19(b).

The probe card is provided with a hard reinforcement plate 176 made of stainless steel, and a printed substrate 177 having a wiring pattern on the upper surface. The printed substrate 177 is reinforced by the reinforcement plate 176 to constitute a hard card substrate. The damper 173a is also a trapezoidal plate in which the front end portion is the short side (see FIG. 19(b)). The damper 173a is mounted on the support body 174 by using a bolt 179a in a superimposed state on the flexible substrate 170 and the insulation sheet 178, which is superimposed on the sloped surface of the support body 174. The damper 173b is mounted on the support body 174 by using a bolt 179b in a superimposed state on the horizontal surface of the support body 174, with the flexible substrate 170 disposed therebetween.

The damper 173a thereby fastens the portion of the flexible substrate 170 disposed toward the probe pin 172 to the sloped surface of the support body 174 from above, and supports the probe pin 172 from above at the front edge portion thereof.

(4) Probe for Wafer Testing Using a Silicon Whisker as a Contact Terminal (Patent Document 4) (Fourth Prior Art)

Art similar to the prior art described in patent document 12 is disclosed in patent documents 13 and 14. FIG. 20 shows a structural diagram of a probe pin and contactor having the probe pin disclosed in patent document 12 as a typical example.

The probe pin shown in FIG. 20 has a structure in which a needle-shaped single crystal 181 is grown on a silicon substrate 180, an Ni under film 182 and an Au film 183 are furthermore formed on the surface of the needle-shaped single crystal 181, and a Pd film 184 is formed at the distal end of the Au film 183. In other words, an Au seed is disposed on the silicon substrate 180, and a needle-shaped single crystal 181 composed of silicon is formed by VLS growth. The probe pin in the diagram is used to measure a semiconductor provided with an electroconductive film on the surface of the needle-shaped single crystal 181, and has a structure in which only the distal end portion is covered by a contact point material.

Next, prior arts of non-contact schemes will be described.

(5) Non-contact Testing Scheme Using a Coil for Communication (Patent Document 5) (Fifth Prior Art)

The structure based on this scheme, and the corresponding testing method will be described with reference to FIGS. 21(a) to 21(c). FIG. 21(a) is a plan view of the wafer 190, and a plurality of semiconductor chips 196 is formed on the wafer 190. FIG. 21(b) is an enlarged view of the round frame portion in which the semiconductor chip 196 is disposed on the wafer 190 in FIG. 21(a). Coils 192A and 192B for communication, which are used exclusively for semiconductor testing, are formed on the semiconductor chips 191A and 191B, respectively, as shown in FIG. 21(b); and the coils 192A and 192B and connection terminals 193A and 193B are connected by wirings 194A and 194B, respectively. The coils 192A and 192B for communication are both rectangular spiral-shaped coils and are formed on the circuit surface side of the semiconductor chips 191A and 191B via an insulating surface-protecting film. Two wires are formed on the coil for communication, one of the wires is connected to the connection terminal inside the semiconductor chip, and the other wire is connected to a connection terminal by way of a scribe line.

Testing is carried out in the manner shown in FIG. 21(c) using a semiconductor chip having this structure. In other words, a testing signal is wirelessly outputted from a head 195 of the semiconductor device to the communication coil 192A of the semiconductor chip 191A. The function of the semiconductor chip 191A is tested by receiving the output signal from the corresponding semiconductor chip 191A. The head 195 or semiconductor chip is moved, whereby the semiconductor chips are tested in a sequential manner.

(6) Non-contact Testing Scheme Using Capacitive Coupling (Patent Document 6) (Sixth Prior Art)

FIG. 22 shows a structural diagram of the invention disclosed in patent document 6. In a voltage probe chip 210, sensor units 211 are disposed in mutually corresponding positions to the signal wires 201 that are to be monitored in an LSI chip 200. Voltage variations of the semiconductor chip 200 are detected by the voltage probe chip 210 as induced voltage brought about by electrostatic induction.

More specifically, the voltage probe chip 210 is composed of an amplifier or another signal processing circuit 213 formed on a silicon substrate 212, sensor units 211 arrayed in mutually corresponding positions to the signal wires 201 in the LSI chip 200, and silicate glass (dielectric material layer) 214 having a thickness of 0.5 μm on the surface of the sensor units 211. The surface of the dielectric material layer 214 is smoothly polished.

The LSI chip 200 has a wiring layer 203 formed on the surface of a silicon substrate 202, and has signal wires 201 disposed at fixed intervals on the surface of an interlayer insulation film 204 that is formed on the wiring layer 203. The wiring layer 203 is connected to signal wire electrodes of the signal wires 201 via through-holes provided to the interlayer insulation film 204. The surface of the interlayer insulation film 204 in which the signal wire electrode is exposed has been made flat by CMP (chemical-mechanical polishing) or the like.

The electrodes of the signal wires 201 of the LSI chip 200 and the sensor units 211 of the voltage probe chip 210 are positionally aligned, pressure is applied by vacuum suctioning, and chips are fixed in place by direct bonding. In this state, the LSI chip 200 is driven by applying voltage to external lead terminals (not shown). The induction voltage at this time is detected by the sensor units 211 of the voltage probe chip 210 and monitored via the signal processing circuit 213.

Patent Document 1: U.S. Pat. No. 5,969,533
Patent Document 2: Japanese Laid-open Patent Application No. 5-226430
Patent Document 3: Japanese Laid-open Patent Application No. 6-334006
Patent Document 4: Japanese Laid-open Patent Application No. 11-190748
Patent Document 5: Japanese Laid-open Patent Application No. 2003-273180
Patent Document 6: Japanese Laid-open Patent Application No. 2003-344448
Patent Document 7: Japanese Laid-open Patent Application No. 5-243344
Patent Document 8: WO 98/58266
Patent Document 9: Japanese Laid-open Patent Application No. 6-334005
Patent Document 10: Japanese Laid-open Patent Application No. 6-331655
Patent Document 11: Japanese Laid-open Patent Application No. 6-324081
Patent Document 12: Japanese Laid-open Patent Application No. 10-038918
Patent Document 13: Japanese Laid-open Patent Application No. 2002-257859
Patent Document 14: Japanese Laid-open Patent Application No. 5-198636

DISCLOSURE OF THE INVENTION

Problems the Invention is Intended to Solve

However, the conventional techniques described above are subject to the following problems.

First, the problems of the contact schemes of the first to third prior arts will be described from the viewpoint of narrowing the pitch and high-speed signal transmission.

With the first prior art, the probe is composed of metal needles and shielding plates that are stacked in four tiers, and the pitch of the distal ends of the four-tiered contact terminals is 50 µm. Following are problems for achieving a narrower pitch.

1. Machining is very difficult and manufacturing costs are higher because the metal needles must be ultrafinely machined and the material must be modified.

2. Sufficient durability performance cannot be obtained because the rigidity of the metal needle is insufficient, even if machining has been performed.

3. Since the length of the metal needles is considerable, signal transmission loss increases due to resistance, signal delay is considerable, and the transmission of high-frequency signals becomes difficult.

The second prior art involves a structure that uses a membrane sheet, and a ground can be formed on the back surface and impedance matching can be assured, resulting in a structure that is advantageous for high-speed signal transmission. However, contact with external electrodes of the semiconductor device is performed via metal protrusions (bumps). The metal protrusions must be kept at a certain height or greater so that contact is not made with the circuit surface of the semiconductor device when the protrusions and the surface are brought together. A membrane sheet in the form of film is used on the substrate and a plating-based manufacturing method is used. Therefore, the pitch of the metal protrusions is about 60 µm at a minimum, and it is difficult to obtain a narrower pitch.

The third prior art uses a membrane sheet in the same manner as the second prior art, and is therefore advantageous for high-speed signal transmission. However, since a flexible material in the form of a film is used as a substrate, it is difficult to bring the positional accuracy of the metal leads in the pitch direction to a desired value (±1.0 µm or less) in the case of a very small pitch of 40 µm or less because of the heat history of the process for manufacturing the film substrate. A probe pin is sometimes formed from a single material, which is an elastic metal material, making it difficult to obtain good contact characteristics because selection has not been made based on the material to be contacted.

The first to third prior arts have problems such as those described above, and a particular problem in terms of obtaining a narrower pitch is that the limit of the pitch is 40 µm.

Next, the problems of the first to third prior arts will be described from the viewpoint of contact marks on the electrodes of the semiconductor device.

FIGS. 23(a) through 23(d) show photographs of contact marks formed on the electrodes in a case in which the electrodes of a semiconductor device have been probed using the first to fourth prior arts. The first to third prior arts produce contact marks such as those shown in FIGS. 23(a) to 23(c) in accordance with a mechanism in which the contact terminals are brought into contact with the electrodes, and an overdrive (indentation distance, equal to the distance that the semiconductor device has been raised relative to the contact terminal, with the point at which the contact terminal makes contact with the electrode as a reference) is then applied, whereby the oxide film on the surface of the aluminum electrode is broken and contact is made.

FIG. 24(a) is a view of the relation between the actual joining surface area and the reduction in the sized of the electrode 220 of the semiconductor device. The ratio of the contact mark 222 produced by probing in relation to the joining surface area (pressure surface area 221) is low when the pitch of the electrode pads is considerable, as shown in left diagram of FIG. 24(a). However, when the pitch of the electrode pads is low, the ratio of the contact mark 222 increases, as shown in FIG. 24(a). For example, when the pitch of the electrode pads from the left to the right in FIG. 24(a) is 100, 80, and 75 µm, and the actual joining surface area is defined to be the value obtained by dividing the difference between the joining surface area (pressure surface area 221) and the surface area of the contact mark resulting from probing by the joining surface area, the ratio of the contact mark 222 is 86, 79, and 75%, respectively; and it is apparent that the ratio of the contact mark 222 increases. When the actual joining surface area is reduced in this manner, inadequate contact occurs in the sense that peeling develops in cases in which bumps are formed for wire bonding and flip chip mounting in a subsequent step. This problem is shared by the first to third prior arts in which contact marks are produced.

Methods of solving this problem include forming the electrodes 223 of the semiconductor device into rectangular shapes and separating the probing area 224 and the bonding area (connection area 225) in the manner shown in FIG. 24(b), and forming an Ni film 232 and an Au film 233 by electroless plating on the aluminum electrode 231 and reducing the contact pressure in order to remove the effect of the oxide film on the surface of the aluminum electrode 231. However, the rectangular electrode shape increases the chip size and reduces the number of chips in a wafer. Therefore, costs are increased and a limit is placed on chip size reduction. There is also a problem in that the surface treatment on the aluminum electrode 231 increases the number of processes, resulting in higher manufacturing costs. These problems are shared by the first to third prior arts.

Problems that make it more difficult to narrow the pitch, achieve high-speed signal transmission, and remove contact marks will be described in relation to the fourth prior art. The fourth prior art is one in which contact with the external electrodes of a semiconductor device is performed by using a pin that is obtained by plating an acicular single crystal composed of silicon. The electrodes of the semiconductor device are probed in a perpendicular manner, and contact is achieved by making use of buckling deformation. For this reason, the contact marks can be kept very small, as shown in FIG. 23(d), but since the contact pressure is low, it is difficult to obtained good contact with materials such as aluminum and copper, which have a surface oxide film. To narrow the pitch, a pin having a diameter of about 10 µm must be formed when the pitch is in the range of 40 µm or less. In this case, techniques for mounting a metal bump on an Si mesa prior to growing a pin become much more difficult to perform, stress occurs when a metal film is applied, and damage is brought about by the trimming of the distal end after the pin is formed. Positional accuracy that corresponds to the electrode pitch of the semiconductor device is therefore difficult to ensure. Also, since the pin diameter is extremely small, there is a problem in that the pin is damaged due to insufficient pin strength when an overdrive is applied.

The problems of the first to fourth prior arts as contact schemes were described above. Next, the problems of the fifth and sixth prior arts as non-contact schemes will be described.

The fifth and sixth prior arts are both non-contact schemes and are therefore advantageous in that contact marks on the semiconductor device electrodes can be eliminated. These prior arts have the following problems, however.

The fifth prior art has the following problems because a coil for communication must be formed inside the chip.

1. An additional coil formation process is required, a coil formation area must be provided inside the chip, the chip size is increased, and higher costs are incurred.

2. Since the communication coil and the connection terminals are wired, the wiring must be severed after testing has been completed. At this time, there is no problem in that the wiring on the scribe line can be severed using a conventional process, but severing the wiring inside the chip entails the addition of another process, and this leads to higher costs.

3. The chips on a wafer are aligned in close proximity, and there is therefore a possibility the signals will be exchanged with chips adjacent to the desired chip to be tested.

4. Since there is no description of the method for supplying electric power, there is a possibility that the supply capacity will be insufficient and the semiconductor chip cannot be driven if the power supply were to be carried out wirelessly.

In the sixth prior art, the electric power supplied to an LSI chip is used in a drive arrangement in which a voltage used in an actual operation is applied to an external lead terminal, and it is particularly assumed that a general cantilever probe will be used because it is not even known what type of probe is used. In this case, the following problems arise.

1. Large contact marks are formed on the power supply electrodes, and joining defects occur.

2. The structure by which a signal is brought out from the voltage probe chip to the exterior is formed using a TAB or a wire. Therefore, a delay occurs due to transmission loss in high-speed signal transmission.

3. The voltage probe chip and the LSI chip have polished flat surfaces, and the dielectric material layer is also high-hardness silicate glass. Therefore, the two chips must be adjusted to a very high degree of parallelism when brought into contact with each other.

4. One of the two chips is damaged when adjustment to the parallelism is displaced even by a small amount.

5. The wiring layer of the LSI chip has a pitch of 10 μm or less. It is impossible to use a general wafer probe in order to perform positioning at this level. Therefore, a special apparatus is required, and costs are increased.

In summary of the problems described above, the prior arts that use a contact method have problems in that it is difficult to reduce the size of contact marks and to meet the requirements of a pitch that is less than 40 μm or less. On the other hand, the prior arts that use a non-contact method have problems in that it is difficult to reduce the size of the contact marks on the power supply electrodes and to carry out testing using a general apparatus.

The present invention was contrived in view of the foregoing problems, and an object thereof is to provide a semiconductor device testing apparatus and power supply unit used therein that can provide highly reliable connections in a subsequent connection process, form a narrow pitch in a semiconductor device, and reduce costs by eliminating contact marks on electrodes during testing of the semiconductor device.

Means for Solving the Problems

The semiconductor device testing apparatus according to the present invention comprises a testing LSI; a power supply unit; and an intermediate substrate provided so that there is a connection between the testing LSI, and the power supply unit and tester; the testing LSI having a testing circuit and a waveform shaping circuit, a dielectric material layer disposed so as to face a tested semiconductor device, an electrode disposed in a position that corresponds to a position of an external terminal electrode of the tested semiconductor device on a surface of the dielectric material layer facing the tested semiconductor device, and a first penetrating electrode that passes completely through the dielectric material layer, is connected to the electrode, and is used for exchanging signals with the exterior; and the power supply unit having mutually independent elastic probe pins that are disposed in positions that correspond to power electrodes of the tested semiconductor device, and that are provided with a metal protrusion at the distal ends thereof, a substrate that is electrically connected to the probe pins and on which a first wiring layer is formed, and a second penetrating electrode that passes through the substrate.

It is preferred that the metal protrusion in the probe pins be composed of one or more metal layers, and have a structure in which one or more metal layers composed of a material having good contact characteristics are formed on the surface of the metal protrusion in accordance with the material of the power electrodes of the tested semiconductor device, a second wiring layer composed of one or more metal layers is formed on the first wiring layer, and the one or more metal layers formed on the surface of the metal protrusion and the second wiring layer are isolated.

It is preferred that the dielectric material layer be formed from a material having a high relative dielectric constant and elasticity.

The semiconductor device testing apparatus may be configured so as to have a connecting member for connecting the testing LSI and the power supply unit; an anisotropic electroconductive sheet disposed between the testing LSI that is connected by the connecting member, and the power supply unit and the intermediate substrate, and anisotropic electroconductive sheet in which electroconductive particles are concentrated in the electrode portion, or an anisotropic electroconductive sheet in which fine metal wiring is embedded; and a fastening member for fastening the anisotropic electroconductive sheet to the intermediate substrate by supporting the anisotropic electroconductive sheet from the first wiring layer side of the power supply unit by way of the power supply unit.

The testing LSI may be separated into a high-density wiring substrate and a dedicated testing LSI; the high-density wiring substrate may have surface electrodes disposed in positions that correspond to positions of the external terminal electrodes of the tested semiconductor device on the surface facing the tested semiconductor device, back surface electrodes formed on the surface on the opposite side from the surface that faces the tested semiconductor device, and a wiring layer for connecting the surface electrodes and the back surface electrodes; the dedicated testing LSI may have the testing circuit and the waveform shaping circuit; and the high-density wiring substrate and the dedicated testing LSI may be electrically connected.

It is preferred that the volume resistivity of the second wiring layer be less than the volume resistivity of the first wiring layer.

A third metal layer composed of one or more metal layers may be disposed between the first wiring layer and the substrate in the power supply unit.

It is preferred that the volume resistivity of the third metal layer be less than the volume resistivity of the first wiring layer.

The shape of the metal protrusion may be a prismatic shape in which the surface facing the tested semiconductor device has a rectangular shape; the width thereof may be the width of the probe pin or less; the length thereof may be equal to or greater than a dimension obtained by adding the movement distance of the distal portion of the probe pin after the probe pin has made contact with the power source electrode of the semiconductor device, as well as the length that takes into consideration the positional tolerance of the probe pin in the lengthwise direction and the dimensional tolerance of the power source electrode of the semiconductor device; and the height thereof may be equal to or greater than a dimension obtained by, the surface of the first wiring layer being used as a reference, adding an indentation distance after the power source electrode of the tested semiconductor device has made contact with the metal protrusion, as well as the height that takes into consideration the height tolerance of the metal protrusion and the height tolerance of the power source electrode of the tested semiconductor device.

The one or more metal layers formed on the surface of the metal protrusion may be gold or gold alloy layers.

The one or more metal layers formed on the surface of the metal protrusion may have minute concavo-convex shapes on the surface thereof.

The minute concavo-convex shapes may be shapes in which concavities and convexities are formed in the shape of stripes and in which the stripes extend in the same direction as the movement direction of the probe pin, shapes in which concavities and convexities are formed in the shape of stripes and in which the stripes extend in a direction perpendicular to the movement direction of the probe pin, grid shapes, file-tooth shapes, or random shapes.

It is preferred that the minute concavo-convex shapes be minute concavo-convex shapes having a surface roughness of 1 μm or less.

The power supply unit according to the present invention is a power supply unit for a semiconductor device testing apparatus, characterized in comprising mutually independent elastic probe pins that are disposed in positions that correspond to power electrodes of a tested semiconductor device, and that are provided with a metal protrusion at the distal ends thereof; a substrate that is electrically connected to the probe pins and on which a first wiring layer is formed; and a penetrating electrode that passes through the substrate.

It is preferred that the metal protrusion in the probe pins be composed of one or more metal layers, and have a structure in which one or more metal layers composed of a material having good contact characteristics are formed on the surface of the metal protrusion in accordance with the material of the power electrodes of the tested semiconductor device, a second wiring layer composed of the one or more metal layers is formed on the first wiring layer, and the one or more metal layers formed on the surface of the metal protrusion and the second wiring layer are isolated.

It is preferred that the volume resistivity of the second wiring layer be less than the volume resistivity of the first wiring layer.

A third metal layer composed of one or more metal layers may be formed between the first wiring layer and the substrate.

It is preferred that the volume resistivity of the third metal layer be less than the volume resistivity of the first wiring layer.

Effects of the Invention

In accordance with the present invention, contact marks on the electrodes of a semiconductor device, i.e., a tested LSI, can be prevented from forming, whereby highly reliable connections can be formed in the subsequent connection process, and a device having a narrower pitch and dramatically lower costs can be made possible. Testing can be carried out at a higher speed than in conventional testing by using a testing LSI, and selective testing at the same level as a packaged product can be performed with the semiconductor device in a bare chip state. Therefore, the production yield rate for a SiP (System in Package) in which a bare chip is used can be increased and manufacturing costs can be considerably reduced.

BRIEF DESCRIPTION OF THE DRAWINGS

FIG. 1 is a cross-sectional view showing the semiconductor device testing apparatus according to a first embodiment of the present invention;

FIGS. 3K-3T are continuations of FIG. 2A-2J and are cross-sectional views for describing the flow of the method for manufacturing a testing LSI;

FIG. 6 is a diagram for describing the power supply unit shown in FIG. 1, FIG. 6(a) is a plan view of the power supply unit 20 and is a cross-sectional view along the line A-A, FIG. 6(b) is a plan view of the probe section 36 shown in FIG. 6(a), and FIG. 6(c) is a cross-sectional view of the probe section 36 shown in FIG. 6(a);

FIG. 11 is a cross-sectional view showing the semiconductor device testing apparatus according to a fourth embodiment of the present invention;

FIGS. 12A-2G are a cross-sectional views for describing the flow of the method for manufacturing the power supply unit shown in FIG. 1;

FIG. 16 is a diagram for describing the downscaling roadmap of the electrode pitch in an LSI;

FIGS. 21A-21C are cross-sectional views for describing prior art 5;

KEY

Figure 2A:
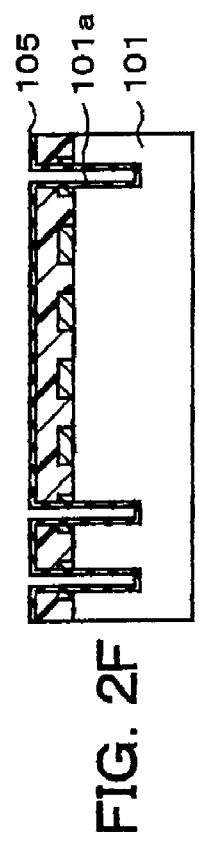
FIGS. 2A-2J are a cross-sectional views for describing the flow of the method for manufacturing a testing LSI shown in FIG. 1.

10: testing LSI
10, 20B: penetrating electrodes
20: power supply unit
21: probe pin
22: substrate
23: first wiring layer
24A: first metal layer
24B: second metal layer
25: second wiring layer
26: cover film
27: third wiring layer
28: third metal layer
30: intermediate substrate
40: anisotropic conductive sheet
50: tested LSI (semiconductor device)

BEST MODE FOR CARRYING OUT THE INVENTION

Next, embodiments of the present invention will be described in detail with reference to the attached diagrams.

First Embodiment

FIG. 1 is a cross-sectional view showing the semiconductor device testing apparatus according to a first embodiment of the present invention, and more particularly shows the details of the power supply unit and the probe section of the power supply unit. The entire configuration of the present embodiment will be described first. The semiconductor device testing apparatus according to the present embodiment is composed of a testing LSI 10, a power supply unit 20, and an intermediate substrate 30, as shown in FIG. 1.

A semiconductor device (referred to as tested LSI 50) as a test object is disposed on a wafer stage 30. A testing LSI 10 has an LSI wafer 101, and an electrode 51 that is the same as the tested LSI 50 is disposed in a position that corresponds to the position of an external terminal electrode 52 of the tested LSI 50 on the LSI wafer 101. The testing LSI 10 has a testing circuit (not shown) for inputting and outputting testing signals, a waveform shaping (comparator) circuit (not shown) for shaping a waveform when signals are inputted and outputted, penetrating electrodes (first penetrating electrodes) 10A for supplying power and inputting and outputting signals to a tester or another external unit, and a dielectric material layer 117 formed on the circuit surface.

In the power supply unit 20, a first wiring layer 23 is formed on a substrate 22, and a plurality of elastic probe pins 21 is electrically connected to the first wiring layer 23. The plurality of probe pins 21 each have independent shapes, and the probe pins 21 are disposed so that the distal end portions of the pins correspond to the positions of the power source electrodes of the tested LSI 50. Metal protrusions are formed in locations that are in contact with the power source electrodes of the tested LSI 50 at the distal end portions of the probe pins 21, and a second metal layer 24B composed of a material having excellent contact characteristics in accordance with the material of the power source electrodes of the tested LSI 50, and also composed of one or more metal layers, is formed on the surface of the metal protrusions. A second wiring layer 25 composed of one or more metal layers is formed on the surface of the first wiring layer 23, and a protective film (cover film) 26 is formed on the surface of the second wiring layer. Penetrating electrodes (second penetrating electrodes) 20B for bringing out signals to the exterior are provided to the substrate 22. The present embodiment is characterized in having a structure in which the second wiring layer 25 composed of one or more metal layers is formed on the first wiring layer 23 that is formed on the substrate 22, and in which the second metal layer 24B of the metal protrusion surface and the second wiring layer 25 are isolated.

A plurality of electrodes 31 is disposed in prescribed locations of the lower surface of an intermediate substrate 30, and the electrodes are connected to the penetrating electrodes 10A of the testing LSI 10 and the penetrating electrodes 20B of the power supply unit 20. Electrodes 32 are disposed on the upper surface of the intermediate substrate 30 in positions that correspond to the electrode positions of a performance board in a probe card, and a wiring layer 33 that connects the electrodes 31 and 32 provided to the upper and lower surfaces, respectively, of the substrate are disposed inside the intermediate substrate 30. The area between the testing LSI 10 and the power supply unit 20 and intermediate substrate 30 is connected by, e.g., solder balls 34 that are disposed between the electrodes 31 and penetrating electrodes 10A, and the penetrating electrodes 20B.

Next, a method for manufacturing a testing LSI will be described with reference to FIGS. 2 to 4.

First, a diffusion process is completed, and an LSI wafer (testing LSI) 101 whose surface is provided with aluminum electrodes 102 as external electrodes is prepared, as shown in FIG. 2(a).

Figure 2B:
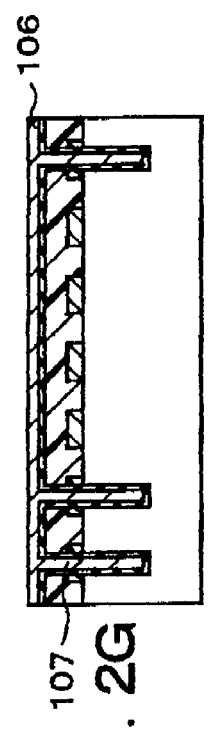

Next, a cover film 103 is formed to a thickness of 10 to 15 μm by CVD on the surface of the LSI wafer 101, as shown in FIG. 2(b). The surface is smoothed by CMP (chemical-mechanical polishing), and a resist 104 is formed on and applied to the entire surface.

Figure 2C:
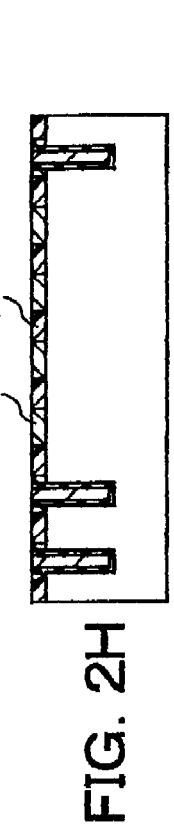

The resist 104 and cover film 103 of the portions that form the penetrating electrodes 10A (FIG. 1) are subsequently removed by photolithography, as shown in FIG. 2(c). The dimension of the removed portions is about 50% of the size of the aluminum electrodes 102. In other words, the size of the removed portion is 50 μm when the size of the aluminum electrodes 102 is 100 μm.

Figure 2D:
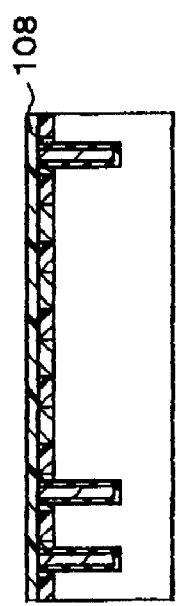

Next, the aluminum electrodes 102 corresponding to the removed portions are removed by wet etching or dry etching, as shown in FIG. 2(d).

Figure 2E:
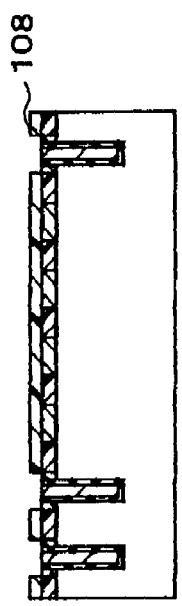

Next, a through-hole 101a is formed to a depth of 200 to 300 μm in the LSI wafer 101 by RIE (Reactive Ion Etching), as shown in FIG. 2(e).

Figure 2F:

An insulation film 105 is then formed to a thickness of 0.2 μm by CVD over the entire surface, including the inner wall of the through-hole 101a, as shown in FIG. 2(f).

Figure 2G:
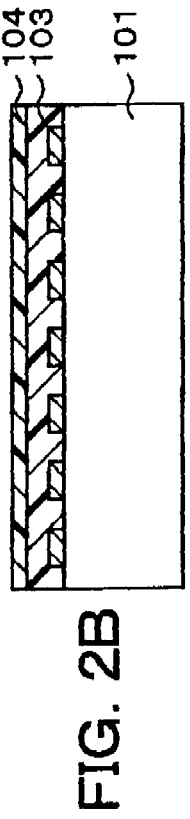

After step (f), a barrier/seed layer 106 is formed from a TiN barrier layer having a thickness of 10 nm and Cu seed layer having a thickness of 0.15 μm, as shown in FIG. 2(g), and the inside of the through-hole 101a is then filled with Cu plating 107. The penetrating electrodes 10A are formed thereby.

Figure 2H:
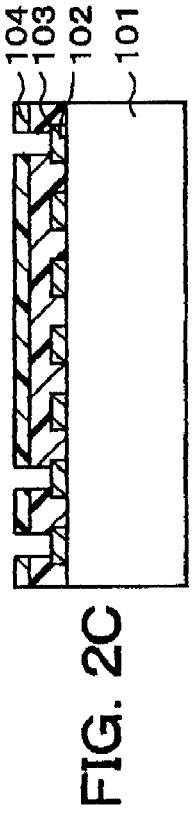

Next, the Cu deposited on the surface is removed by wet etching or by CMP, as shown in FIG. 2(h), and the cover film 103 is removed by dry etching until the surface of the aluminum electrodes 102 is exposed.

Figure 2I:
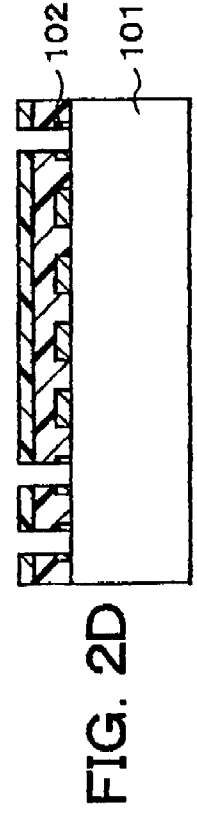
Figure 2J:
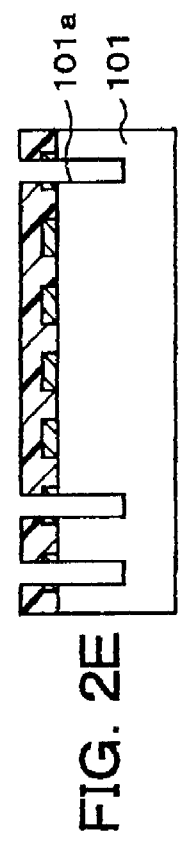

A resist 108 is subsequently coated, as shown in FIGS. 2(i) and 2(j), and the resist of the penetrating electrode portions is removed by etching.

Next, electroless Ni/Au plating 109 is applied to the surfaces of the aluminum electrodes 102 and the penetrating electrodes 10A in order to achieve conductivity, and the resist 108 is removed, as shown in FIGS. 3(k) and 3(l).

The LSI wafer 101 and a support body 110 composed of glass or another material are subsequently bonded together using an adhesive 111, the reverse side is polished until about 10 to 30 µm of Si remains from the bottom surface side of the penetrating electrodes 10A, and the heads of the penetrating electrodes 10A are thereafter exposed by dry etching, as shown in FIGS. 3(m) and 3(n).

Next, an insulation film (SiN, $SiO_2$, or the like) 112 is formed on the reverse surface of the LSI wafer 101 by CVD, as shown in FIG. 3(o).

The insulation film 112 is removed by CMP or dry etching, as shown in FIGS. 3(p) and 3(r). A barrier/seed layer 113 composed of a barrier layer and a seed layer is then formed in order to form back surface electrodes, and the unnecessary portions are removed by milling using a resist 114. The resist is then removed and back surface electrodes 115 are subsequently formed on the back surface side of the penetrating electrodes 10A.

Next, a protective film (passivation film) 116 is formed in the same manner as the front surface side, and the support body 110 is peeled away, as shown in FIGS. 3(s) and 3(t).

Figure 4:
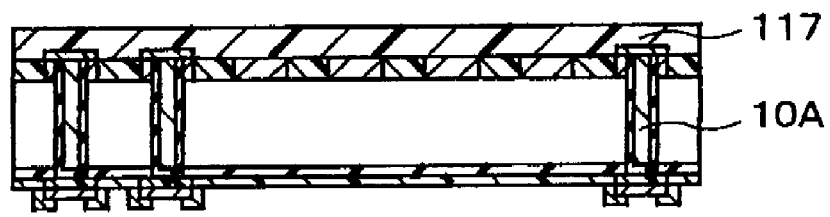
FIG. 4 is a continuation of FIG. 3 and is a cross-sectional view for describing the final step the method for manufacturing a testing LSI.

Next, a silicone gel (dielectric material layer) 117 is coated onto the surface of the circuit to a thickness of 2 to 5 µm, as shown in FIG. 4. Examples of the silicone gel 117 that are preferably used include SE44445CV (registered trademark) or SE4440 (registered trademark) manufactured by Dow Corning Toray Silicone Co., Ltd., or another silicone gel that has a relatively high dielectric constant of 4 to 7. It is also possible to apply an elastomer in the form of a sheet using an adhesive.

The interface structure between the testing LSI 10 and the tested LSI 50 is a structure in which signal transmission is carried out by bringing the external signal electrodes of the testing LSI 10 and the tested LSI 50 into close proximity to each other and achieving capacitive coupling. The signals transmitted from the sending side are therefore transmitted to the receiving side in a state in which a derivative of the waveform is taken at the interface portion. Therefore, a waveform shaping circuit must be mounted so that the waveform whose derivative was taken on the receiving side could be restored to the original waveform. For example, a waveform shaping circuit is mounted on the tested LSI 50 side in the signal pathway through which the signals are transmitted from the testing LSI 10 to the tested LSI 50, and a waveform shaping circuit is mounted on the tested LSI 50 side in the signal pathway through which the signals are transmitted from the tested LSI 50 to the testing LSI 10. Also, a waveform shaping circuit is mounted in both the testing LSI 10 side and the tested LSI 50 side in the signal pathway that handles bidirectional signals.

Figure 5A:
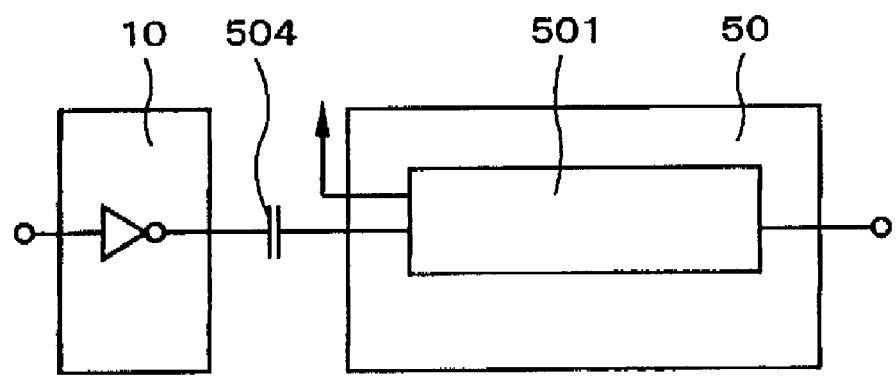
FIG. 5 is a block view of the transceiving unit in the signal pathway through which signals are transmitted from the testing LSI to the tested LSI.
Figure 5B:
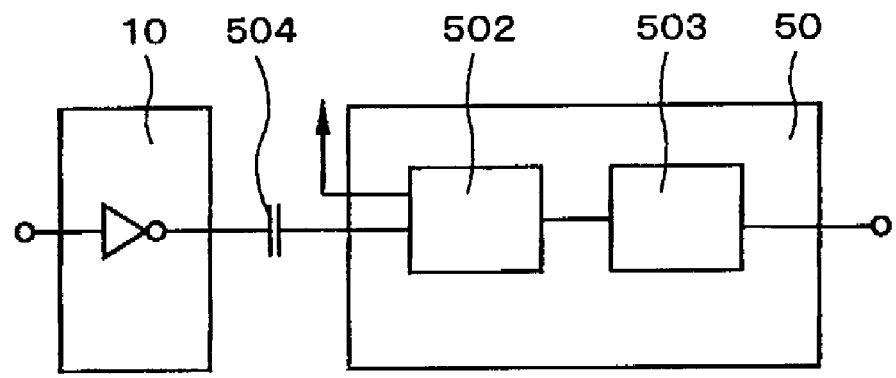

FIG. 5 is a block diagram showing the transceiving unit in the signal pathway through which signals are transmitted from the testing LSI 10 to the tested LSI 50 as an example of the interface structure between the testing LSI 10 and the tested LSI 50. In FIGS. 5(a) and 5(b), the structure is one in which a capacitance 504 is formed between the testing LSI 10 and the tested LSI 50, the external signal electrodes of the testing LSI 10 and the tested LSI 50 are brought into close proximity with each other, and signal transmission is carried out by capacitive coupling. Waveforms are restored using a comparator 501 in FIG. 5(a) as well as a preamplifier 502 and holding element 503 in FIG. 5(b). In the tested LSI 50, it is also possible to form the circuit on a scribe line between the chips. In this case, the testing apparatus of the present invention can be applied without increasing the circuit scale.

Next, the materials used in each location and the specific structure of the power supply unit 20 will be described with reference to FIGS. 6(a) to 6(c). FIG. 6(a) is a plan view of the power supply unit 20 and a cross-sectional view along the line A-A. FIG. 6(b) is a plan view of the probe section 36 shown in FIG. 6(a). FIG. 6(c) is a cross-sectional diagram of the probe section 36 shown in FIG. 6(a).

The first wiring layer 23 is formed on the surface of the substrate 22, the pitch interval of the first wiring layer is expanded, as viewed from above, from a small pitch interval in the probe section that corresponds to the power electrodes of the tested semiconductor device, to a large pitch interval that allows connections to be made with the electrode of the intermediate substrate 30, as shown in FIG. 6(a).

The substrate 22 may be made of silicon, which is generally used as a semiconductor material; glass ceramics, which is a material that has a coefficient of thermal expansion approximate to silicon; glass; or the like. The reason for this is to reduce degradation in the pin positioning accuracy due to the thermal history imposed during manufacture of the power supply unit 20, and to reduce positional displacement between the probe pin 21 and the power source electrodes of the tested semiconductor device caused by temperature differences during burn-in testing. Among these materials, glass ceramics is preferably used from the aspect of ease of processing and electrical characteristics.

The first wiring layer 23 is connected to the probe pin 21, as shown in FIGS. 6(b) and 6(c). For this reason, Ni (nickel), which is the same material as a first metal layer 24A that acts as the root portion of the probe pin 21, or an Ni alloy, is used with consideration given to the ease of manufacturing. The width of the first wiring layer 23 is set to be 50 to 60% of the pitch of the power source electrodes of the tested semiconductor device, which is a level at which short-circuiting or leakage does not occur during manufacture. The thickness is the same as the thickness of the first metal layer 24A of the probe pin 21 with consideration given to the ease of manufacture.

The second wiring layer 25 is formed on the first wiring layer 23 for the purpose of increasing the electrical conductivity of the wiring portions and reducing conductor loss. The material used is a metal (e.g., gold, gold/copper alloy, gold/palladium alloy, or copper) in which the volume resistivity is lower than that of Ni or an Ni alloy, which is the material of the first wiring layer 23, and the volume resistivity is in the range of $1 \times 10^{-8}$ to $4 \times 10^{-8}$ $\Omega$m. The area in which the second wiring layer 25 is formed is the entire surface of the first wiring layer 23 over a width obtained by subtracting the manufacturing tolerance from the width of the first wiring layer 23, starting from a location disposed about 2 µm, which is the tolerance level during manufacture, into the substrate 22 from the end portion of the substrate 22 in which the root portion of the probe pin 21 is disposed, as shown in FIG. 6(b). Therefore, the second wiring layer 25 is formed over the entire surface at a width of 28 µm in the case that the width of the first wiring layer 23 is 30 µm.

The probe pin 21 can be manufactured by electrolytic plating, and a metal (e.g., Ni, Ni/iron alloy, Ni/cobalt alloy, or Ni/manganese alloy) having a Young's modulus of 100 GPa or higher can be used as the material for the pin. The width of the probe pin 21 is set to be 50 to 60% of the pitch of the power electrodes of the tested semiconductor device. The thickness and length of the probe pin 21 are determined as constraint conditions so that a desired contact pressure within the limit of elasticity can be obtained and the tested semiconductor device and the probe pin do not interfere when a prescribed overdrive distance (which indicates the distance that the tested semiconductor device is pressed in, with the point at which the electrodes of the tested semiconductor device have made contact used as a reference; hereinafter referred to as OD distance) is applied.

The material of the metal protrusions 35, which are contact points with the power electrodes of the tested semiconductor device, is Ni or an Ni alloy. This is the parent metal of the probe pin 21 and is the same material as the material used the first metal layer 24A. This material is used for portions other than the second metal layer 24B formed on the surface of the metal protrusions 35 in consideration for the adhesion of the first metal layer 24A. It is apparent that another material having the same or greater hardness as Ni may also be used. The width W of the metal protrusions 35 is equal to or less than the width of the probe pin 21; the length L2 of the metal protrusions is equal to or greater than a dimension obtained by adding the movement distance of the distal portion of the probe pin 21 after the probe pin 21 has made contact with the power source electrode of the tested semiconductor device, as well as the length that takes into consideration the positional tolerance of the probe pin in the movement direction and the dimensional tolerance of the electrodes of the tested semiconductor device; and the shape of the metal protrusion is, e.g., a rectangular shape, as shown in FIGS. 6(b) and 6(c). The height H2 of the metal protrusions 35 is equal to or greater than a dimension obtained by, the surface of the first wiring layer 23 being used as a reference, adding an indentation distance after the power source electrodes of the tested semiconductor device have made contact with the metal protrusions 35, as well as the height that takes into consideration the height tolerance of the metal protrusions 35 and the height tolerance of the power source electrodes of the tested semiconductor device.

The surface shape of the metal protrusions 35 is formed into suitable shapes in accordance with the contact object. The surface shape of the metal protrusions is a flat shape without concavities and convexities in the case that the power source electrodes of the tested semiconductor device are gold bumps. Special machining to form a flat shape is not required as long as the surface roughness following completion of electrolytic plating is 0.05 μm or less. The surface is polished when the surface roughness exceeds 0.05 μm. In the case that the power source electrodes of the tested semiconductor device are aluminum or copper, minute concavities and convexities are formed in the surface of the metal protrusions 35 when the roughness level is 1 μm or less in order to break through a natural oxide film that is present on the surface of the power source electrodes. As exemplified in the upper right diagram of FIG. 6(b), the minute concavities and convexities have shapes in which the concavities and convexities are formed in stripes and in which the stripe extending direction is the same direction as the movement direction of the probe pin 21, shapes in which concavities and convexities are formed in the shape of stripes and in which the stripe extending direction is a direction perpendicular to the movement direction of the probe pin 21, grid shapes, file-tooth shapes, or various other shapes. Random shapes may also be adopted.

The second metal layer 24B is formed on the surface of the metal protrusions 35 for the purpose of preventing oxidation of the metal protrusions. For example, the second metal layer 24B is formed from gold or a gold alloy (Au (gold)-Pd (palladium), Au—Co (cobalt), Au—Cu (copper), or the like) to a thickness of 0.05 to 3 μm. In the diagrammed example, the shape of the second metal layer 24B is tabular.

The penetrating electrode 20B is formed so as to pass completely through the interior of the substrate 22, as shown in FIG. 6(a), and a third wiring layer 27 is formed on the surface of the side opposite from the surface on which the first wiring layer of the substrate 22 is formed. Wiring can be brought out to the back surface of the substrate 22 by connecting the third wiring layer 27 and the first wiring layer 23 by way of the penetrating electrode 20B, allowing external IF signals to be transmitted at high speed.

The dimensions of the penetrating electrode 20B are determined by the pitch of the external terminals of the substrate 22. For example, when the pitch is 0.5 mm, the diameter is 200 to 300 μm, and the length (depth) is 100 to 300 μm. The third wiring layer 27 is, e.g., composed of a Ni film having a thickness of 20 μm or less and an Au plating having a thickness of 2 μm or less on the upper layer. The diameter of the wiring portion is 200 to 300 μm when the shape of the wiring portion is circular.

A through-hole 22A is formed in the center portion of the substrate 22, as shown in FIG. 6(a), and the through-hole 22A isolates the probe pin 21 and is needed to accommodate the testing LSI 10. The through-electrode 22A has a depth of 200 μm or more in consideration of the mechanical strength of the substrate 22, and the size of the external shape is a surface area obtained by adding the size determined from the length of the probe pin 21 and the tolerance thereof to the size of the area surrounded by the outer most electrode formed on the tested LSI 50.

Next, the dimensions of the power supply unit 20 will be described using as an example the case in which the pitch of the power source electrodes of the tested LSI 50 is 50 μm.

The width W of the probe pin 21 is a maximum of 35 μm, which is a level at which short circuiting does not occur during manufacturing, and the thickness H1 is 35 μm, which can be formed with a single electrolytic plating cycle. The length L1 of the probe pin 21 is 800 μm, based on the conditions that the length be within the elastic limit when an OD distance of 120 μm is applied to the probe pin 21, and that the length be as short as possible in order to minimize conductor loss and crosstalk noise.

The height H2 of the metal protrusions 35 is set to be a minimum of 100 μm with consideration given to manufacturing accuracy and the fact that the tested LSI 50 and the probe pin 21 must not make contact when the tested LSI 50 is indented to a distance of 80 μm. The second wiring layer 25 formed on the first wiring layer 23 is formed to a width of 32 μm over the entire surface of the first wiring layer 23, starting from a location disposed about 2 μm, which is the tolerance level during manufacture, into the substrate 22 from the end portion of the substrate 22 in which the root portion of the probe pin 21 is disposed. The length L2 of the second metal layer 24B formed on the surface of the metal protrusions 3S must be 30 μm or more, considering that the positional accuracy is ±1 μm, the manufacturing accuracy is ±2 μm, and the length required for the second metal layer 24B in order to always make contact with the power source electrodes of the tested LSI 50 is 27 μm when the indentation distance is 80 μm. The thickness of the second metal layer 24B is set to 2 μm with consideration for manufacturability.

Figure 7:
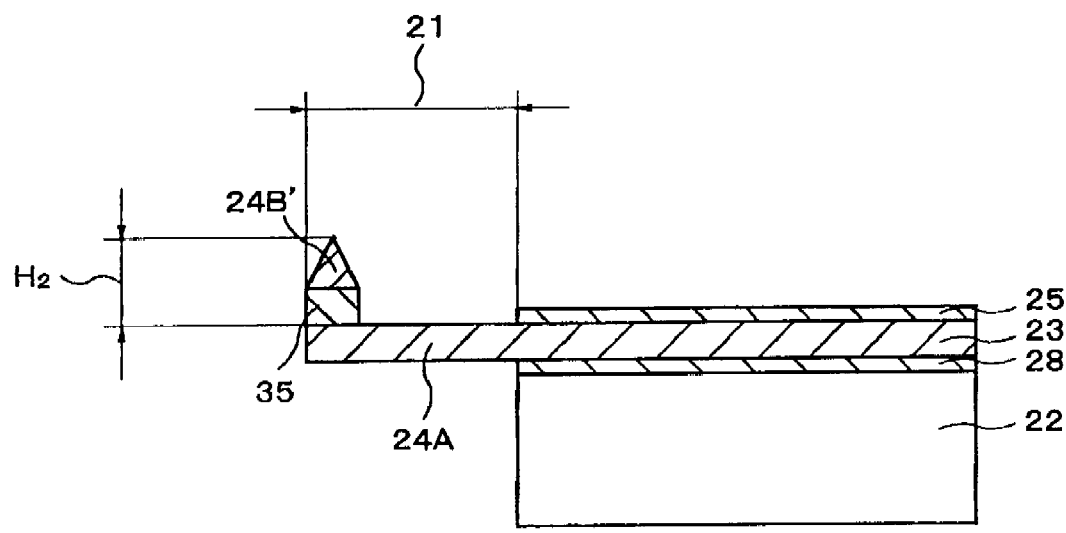
FIG. 7 is a diagram showing another example of the probe section in the power supply unit of the first embodiment.

A pyramidal fourth metal layer 24B' may be provided in place of the second metal layer 24B, as shown in FIG. 7. The pyramidal metal layer 24B' may be formed into a desired pyramidal shape by anisotropically etching silicon using KOH (potassium hydroxide), and can furthermore be obtained by metal plating. The fourth metal layer 24B' shown in FIG. 7 can be formed by the transfer connection of the pyramidal bumps to the metal projection parts formed on the first metal layer 24A.

The effect of the present embodiment will be described next. The semiconductor device testing apparatus according to the present embodiment has effects such as the following.

1. Contact marks on the electrodes of the tested LSI 50 can be dramatically reduced.

2. An ultra fine pitch of 40 μm or less can be accommodated.

3. The number of pins in the power supply unit 20 can be considerably reduced.

4. The level of tolerance of adjustment to the parallelism between the testing LSI 10 and the tested LSI 50 can be increased.

5. Long-term reliability of the probe pin 21 of the power supply unit 20 can be assured and sufficient serviceability obtained.

The reasons for these effects will be described below. In the present embodiment, there are two reasons that contact marks on the electrodes of the tested LSI 50 can be dramatically reduced. The first reason is that signal transmission by non-contact capacitive coupling is used. The contact marks of signal electrodes can thereby be eliminated. The second reason is that a finger lead probe in which the structure of the electrical contact point part has been optimized in accordance with the contact object is used as the contact terminal of the power source electrodes, whereby stable contact at very low pressure can be obtained. For example, stable contact against aluminum electrodes having a pitch of 50 μm can be obtained at an OD distance of 50 μm and a contact pressure of 0.3 g/pin or more. This contact pressure is 1/20 or less than that of a conventional cantilever method, and contact marks can be reduced on the submicron order level. Also, the number of electrodes in which contact marks can be eliminated is increased by making contact with several power source electrodes in a single location.

Next, there are three main reasons that an ultra fine pitch of 40 μm or less can be accommodated. The first reason is that accuracy degradation due to thermal history of the manufacturing steps can be prevented by using a material that has a lower coefficient of thermal expansion than glass ceramics, glass, silicon, or another PI (polyimide film) for the substrate 22. The second reason is that thickness can be kept at a fixed level with a very fine pin width by using electroforming techniques, and sufficient contact pressure can thereby be assured. For example, a pin thickness of 10 μm can be obtained at a pin width of 10 μm. The third reason is that the probe pin 21 and the wiring layer on the substrate 22 can be formed according to an additive method by applying micromachining techniques.

The reason that the number of pins can be considerably reduced in the power supply unit 20 is that contact on the signal electrodes is not required and the contact can be made with a fixed number of the power source electrodes in a single location.

The reason that the tolerance level of adjustment to the parallelism between the testing LSI 10 and the tested LSI 50 can be increased is that an elastic dielectric material can be used for the circuit surface of the testing LSI 10, whereby a small amount of variability in the parallelism can be accommodated by using a dielectric material layer 117.

The reason that the long-term reliability of the probe pin 21 can be assured in the power supply unit 20 is as follows. The second metal layer 24B formed on the surface in contact with the power source electrodes of the tested LSI 50 in the probe pin 21, and the second wiring layer 25 formed on the first wiring layer 23 are isolated; and the structure of the probe pin 21 excluding the second metal layer 24B is formed from a single elastic material. The metal protrusions are disposed on the portions in contact with the power source electrodes of the tested LSI 50, whereby only the power source electrode portions of the tested semiconductor device can make contact with the metal protrusions when a wafer stage 300 is elevated and the tested LSI 50 is brought into contact with the probe pin 21. In the case that metal protrusions are not provided or a thin metal layer is used, the probe pin 21 makes contact with portions other than the power source electrodes of the tested LSI 50. Therefore, contact pressure is reduced, the OD distance is increased, and long-term reliability is compromised even if initial contact were to be assured. Therefore, providing metal protrusions is a very effective way of achieving stable contact at a short OD distance and maintaining long-term reliability.

Figure 8:
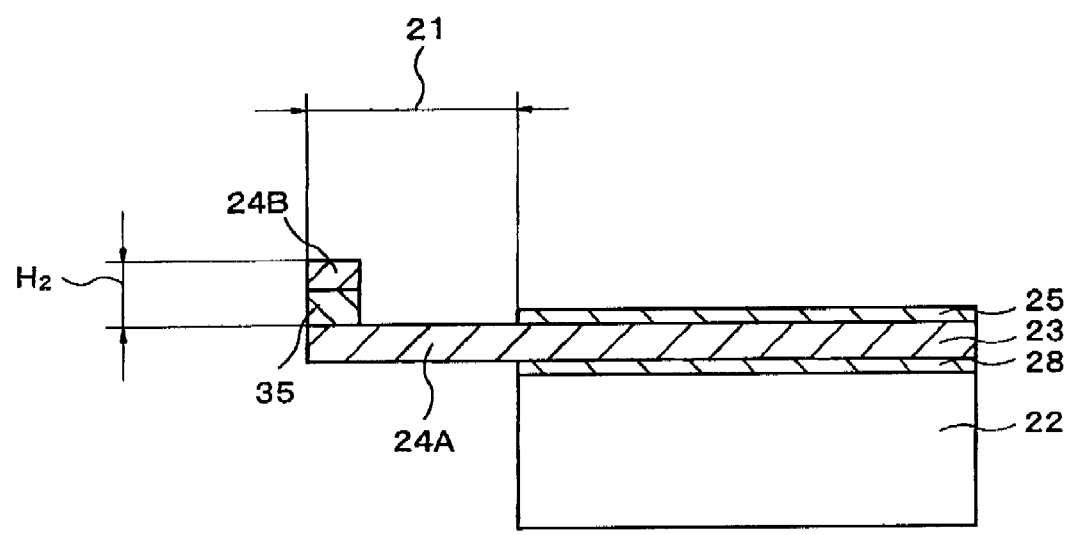
FIG. 8 is a diagram showing yet another example of the probe section in the power supply unit of the first embodiment.

Next, another configuration example of the probe section will be described with reference to FIG. 8. The point of difference between the probe structure of FIG. 8 and the probe structure of FIG. 1 is that a third metal layer 28 is disposed between the first wiring layer 23 and the substrate 22. The third metal layer 28 has a lower volume resistivity than does Ni or an Ni alloy, which is the material of the first wiring layer 23, and is formed using a metal (e.g., gold, gold/copper alloy, gold/palladium alloy, and copper) having a volume resistivity in the range of $1\times10^{-8}$ to $4\times10^{-8}$ Ωm as the material. Such a structure makes it possible to reduce conductor loss during high-speed transmission and to dramatically improve signal transmissivity characteristics, because a high conductivity can be obtained in comparison with the structure adopted for the wiring layer of the power supply unit 20 in the first embodiment. The present structure is particularly effective when signal transmission of 1 GHz or higher is required. When the signal transmission is 1 GHz or lower, sufficient transmission characteristics can be obtained using the wiring structure in the first embodiment. As shown in FIG. 7, the third metal layer 28 may be applied to the probe section of FIG. 7.

Second Embodiment

Figure 9:
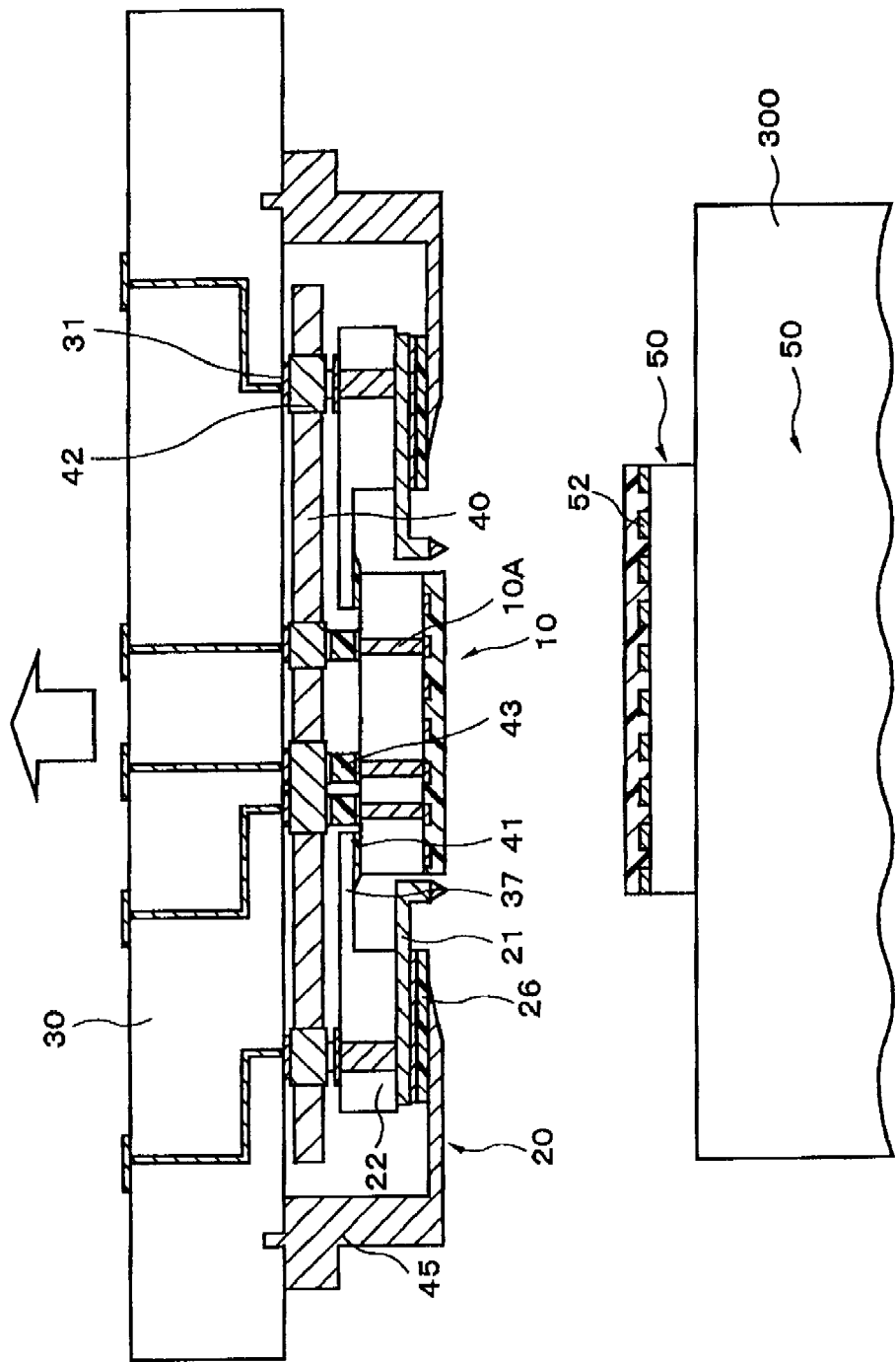
FIG. 9 is a cross-sectional view showing the semiconductor device testing apparatus according to a second embodiment of the present invention.

FIG. 9 is a cross-sectional view showing the semiconductor device testing apparatus according to a second embodiment of the present invention. The difference between the present embodiment and the first embodiment is that protrusions 37 that extend in the direction of the testing LSI 10 are disposed on the back surface side (upper surface side of the substrate 22) of the substrate 22 in the power supply unit 20, and the protrusions 37 and the end portion of the back surface (upper surface of the testing LSI 10) of the testing LSI 10 are connected and fastened using an adhesive 41. In addition, an anisotropic electroconductive sheet 40 is disposed between the testing LSI 10, and the power supply unit 20 and intermediate substrate 30. The anisotropic electroconductive sheet 40 is one in which electroconductive particles are concentrated in the electrodes 42 formed in prescribed locations on the sheet, or is one in which fine metal wires are embedded. The electrodes 42 are connected to electrodes 31 disposed on the lower surface of the intermediate substrate 30. The testing LSI 10, power supply unit 20, and anisotropic electroconductive sheet 40 have a structure in which the surface of the protective film 26 of the power supply unit 20 is supported from below by a pressing jig 45 as fastening means detachably disposed on the intermediate substrate 30, and are thereby mounted on the intermediate substrate 30. The penetrating electrodes 10A of the testing LSI 10 and the electrodes 42 of the anisotropic electroconductive sheet 40 are connected via bumps 43. Such a structure improves detachability and facilitates the adjustment of the parallelism between the power supply unit 20, and the tested LSI 50 and testing LSI 10, and has the merit of being able to accommodate variability in the parallelism.

Third Embodiment

Figure 10:
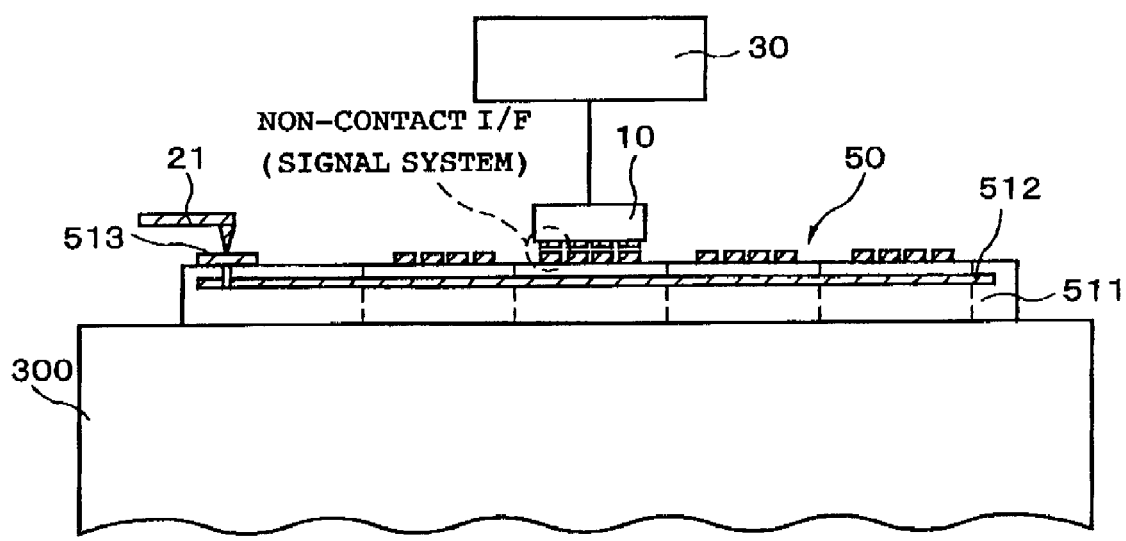
FIG. 10 is a cross-sectional view showing the semiconductor device testing apparatus according to a third embodiment of the present invention.
Figure 12A:
Figure 12B:
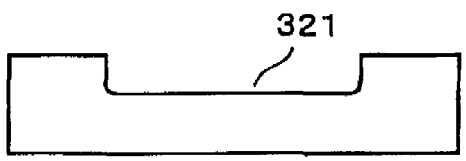
Figure 12C:
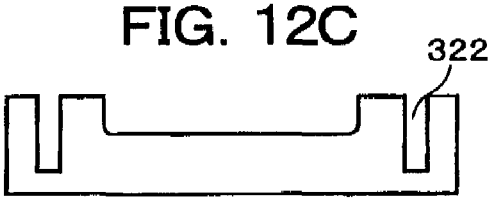
Figure 12D:
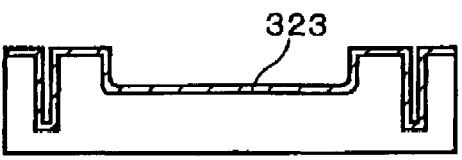
Figure 12E:
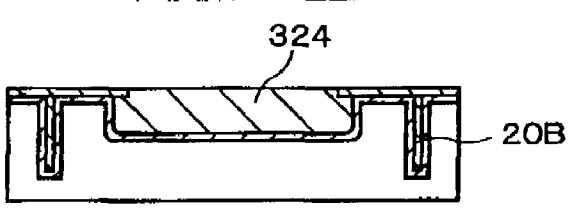
Figure 12F:
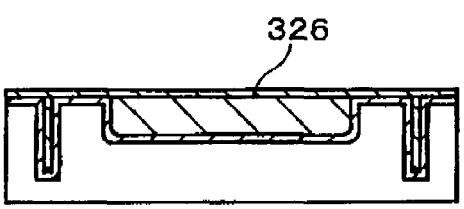
Figure 12G:
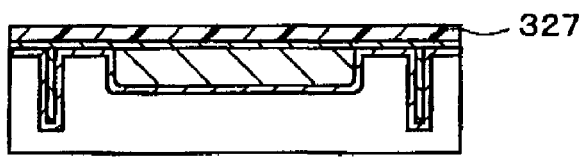
Figure 13H:
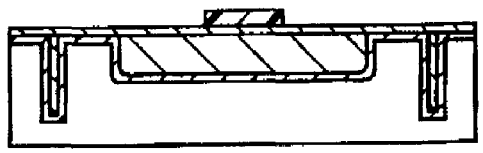
FIGS. 13H-13N are continuations of FIGS. 12A-12G and are cross-sectional views for describing the flow of the method for manufacturing the power supply unit.
Figure 13I:
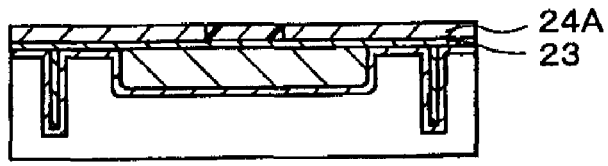
Figure 13J:
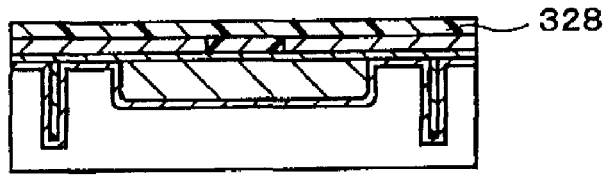
Figure 13K:
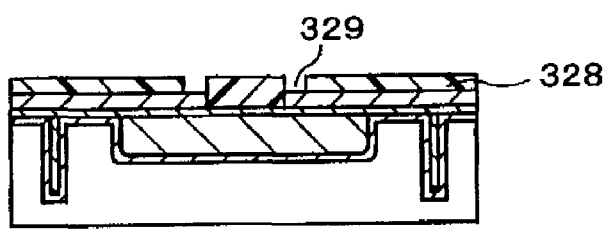
Figure 13L:
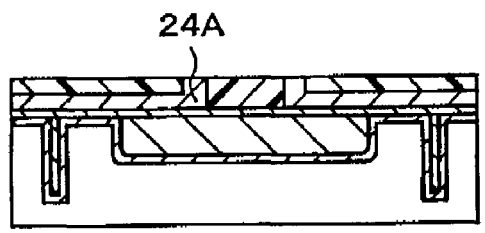
Figure 13M:
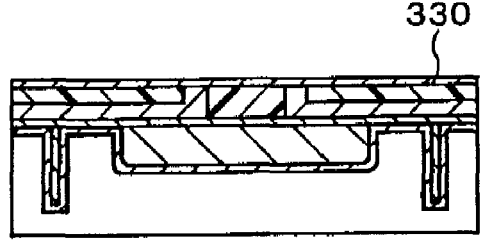
Figure 13N:
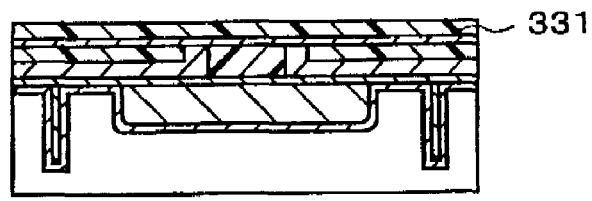
Figure 14O:
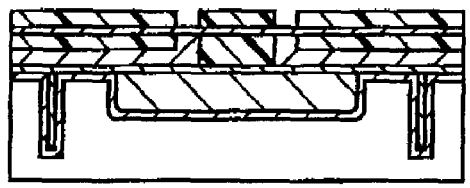
FIGS. 14O-14U are continuations of FIGS. 13H-13N and are cross-sectional views for describing the flow of the method for manufacturing the power supply unit.
Figure 14P:
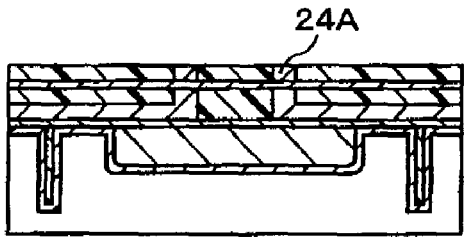
Figure 14Q:
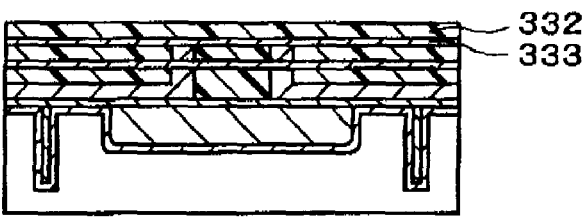
Figure 14R:
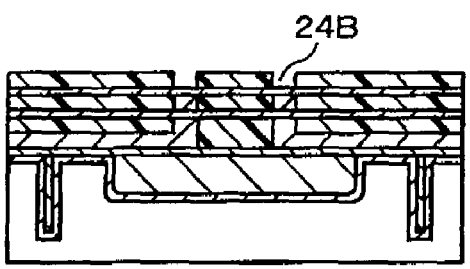
Figure 14S:
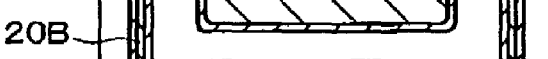
Figure 14T:
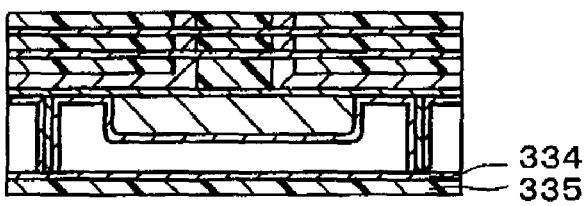
Figure 14U:
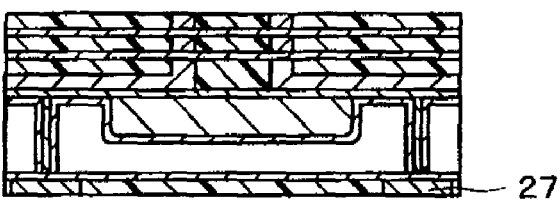
Figure 15V:
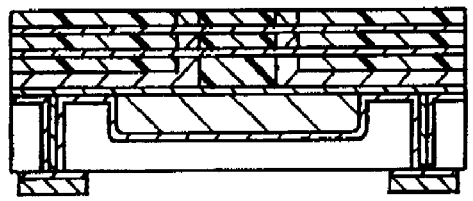
FIGS. 15V-15ZZ are continuations of FIGS. 14O-14U and are cross-sectional views for describing the flow of the method for manufacturing the power supply unit.
Figure 15W:
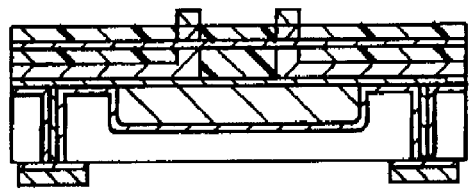
Figure 15X:
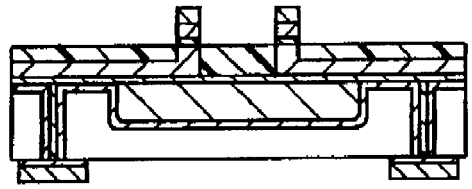
Figure 15Y:
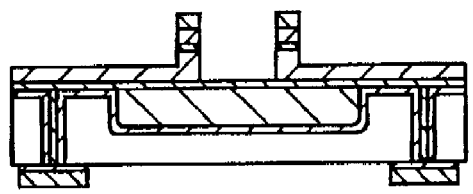
Figure 15Z:
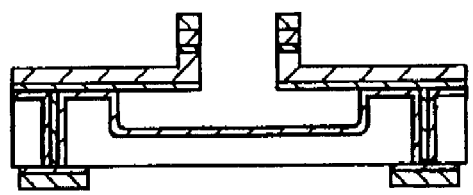
Figure 15Z:
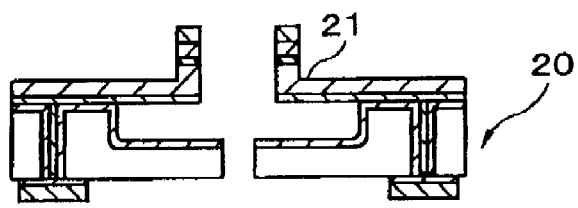
Figure 17:
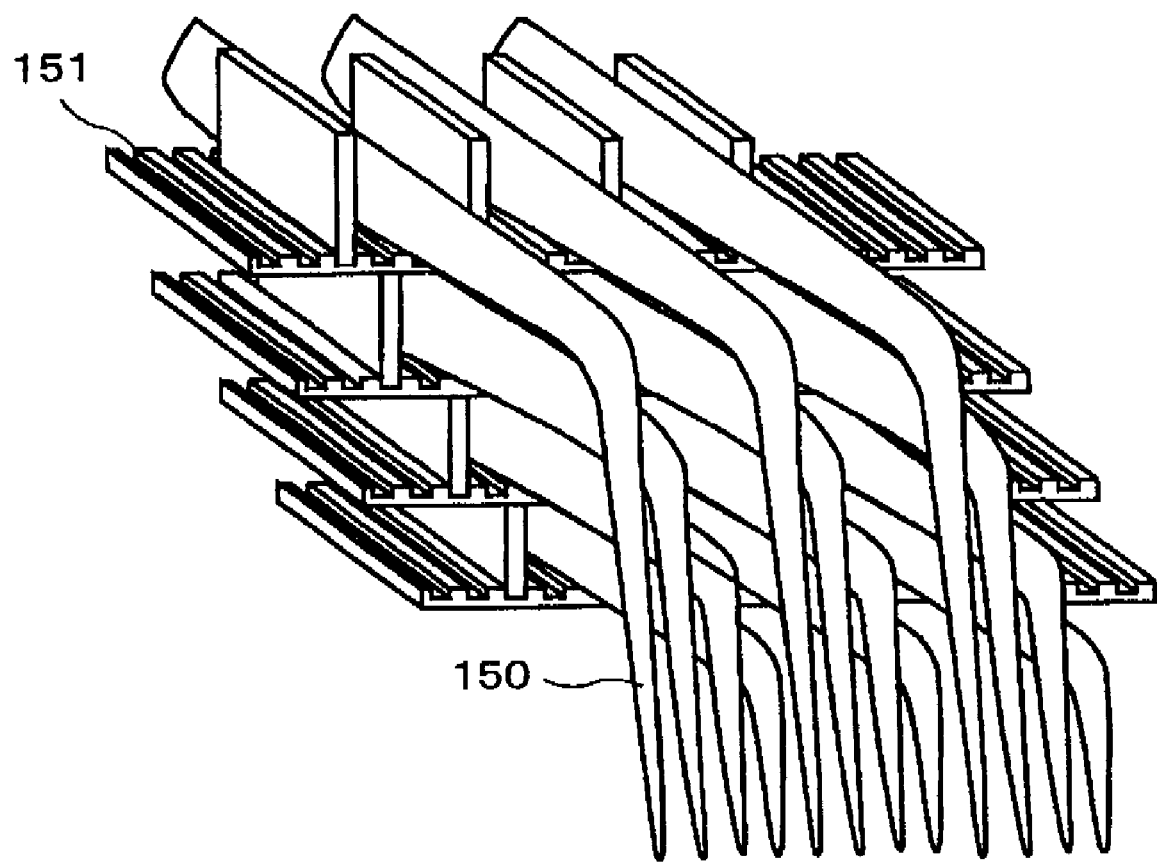
FIG. 17 is a perspective view for describing prior art 1.
Figure 18:
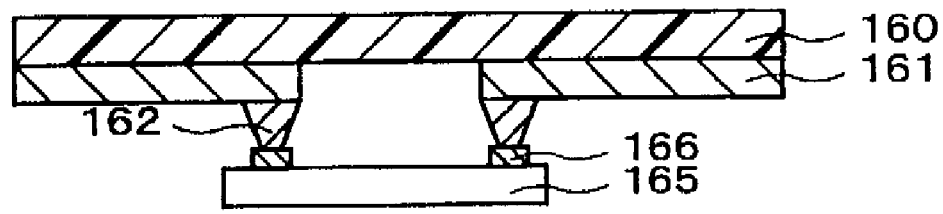
FIG. 18 is a perspective view for describing prior art 2.
Figure 19A:
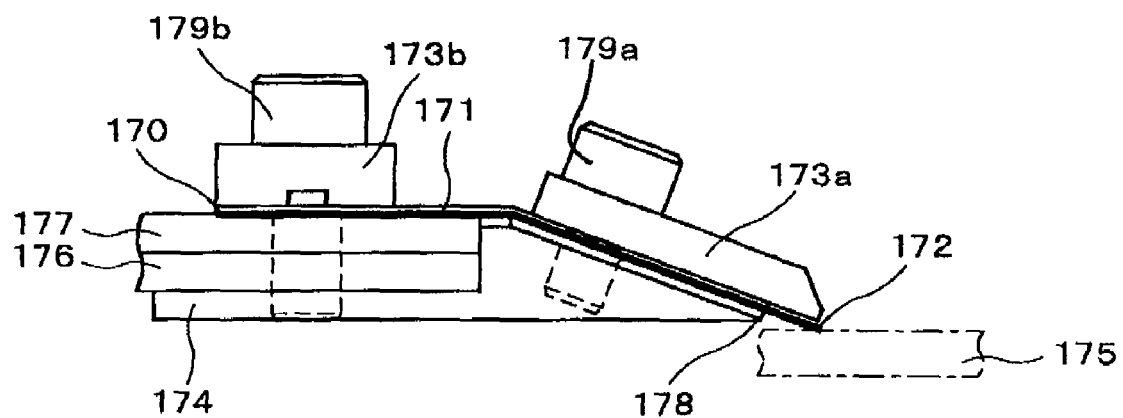
FIG. 19(a) is a side view for describing prior art 3 and FIG. 19(b) is a perspective view thereof.
Figure 19B:
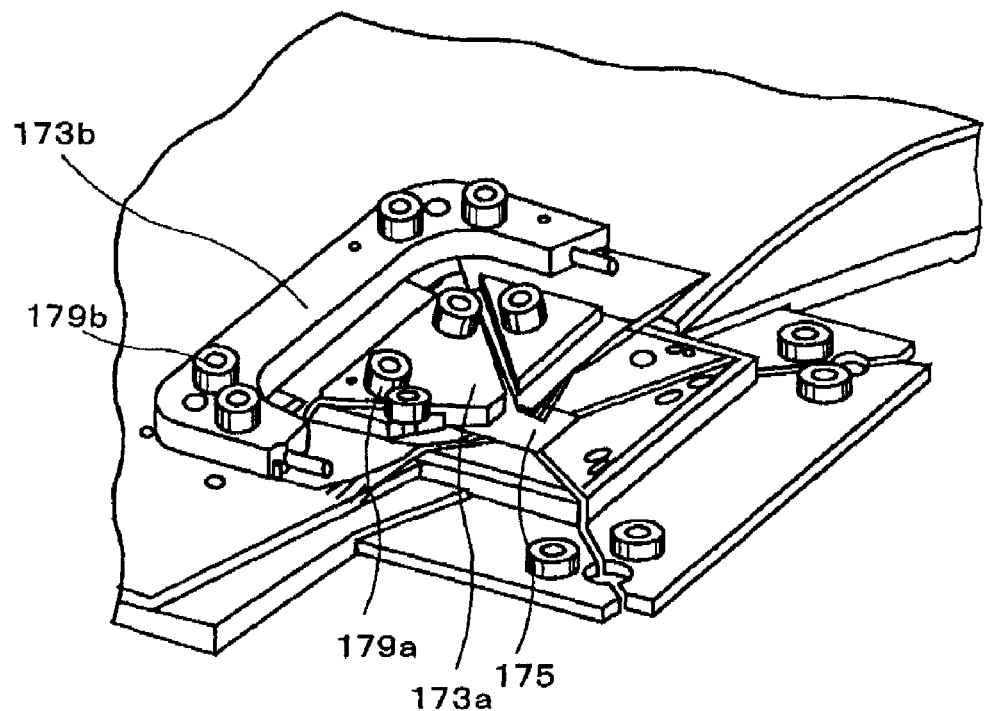
Figure 20:
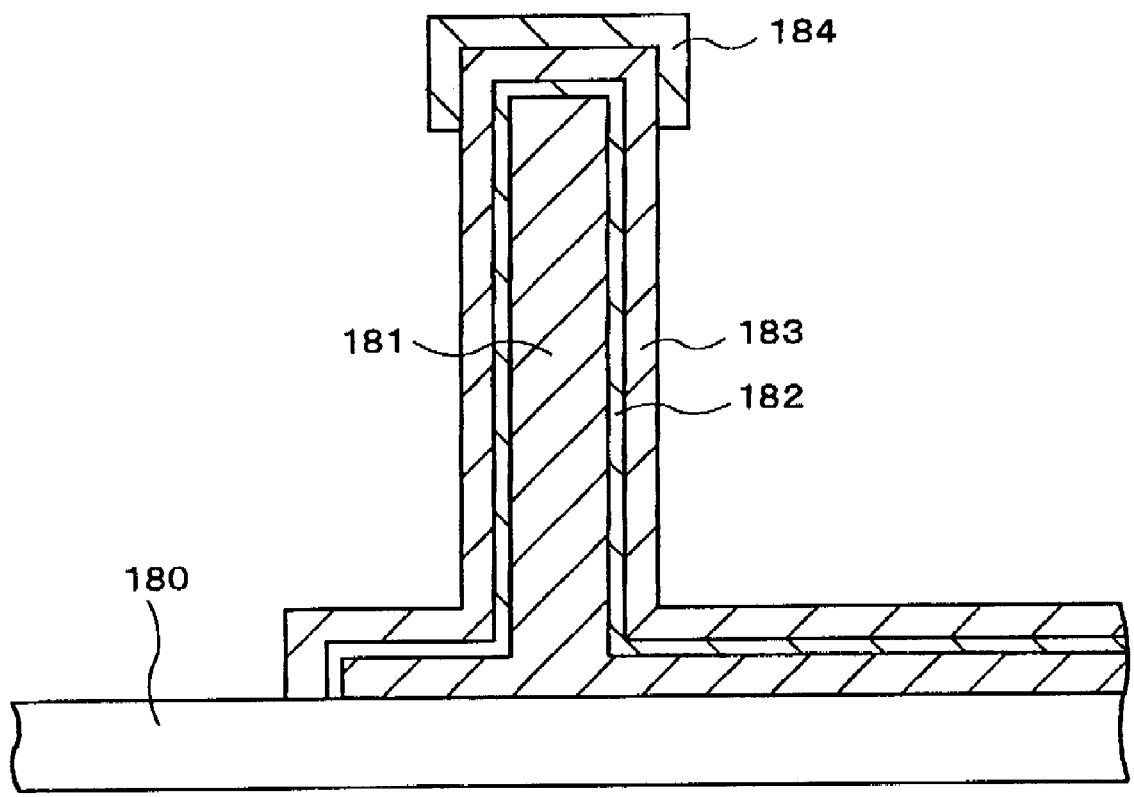
FIG. 20 is a cross-sectional view for describing prior art 4.
Figure 22:
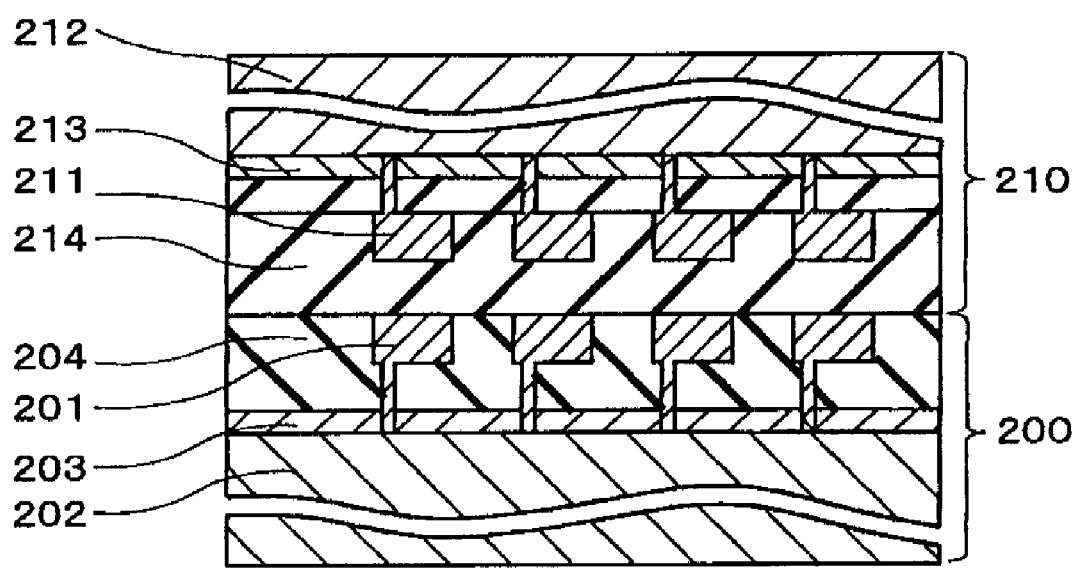
FIG. 22 is a cross-sectional view for describing prior art 6.
Figure 23A:
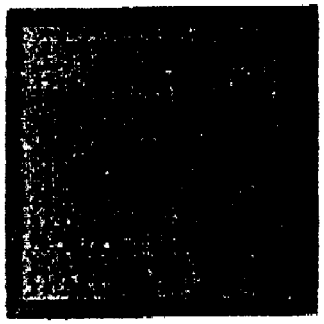
FIG. 23 is a diagram for describing the problems of prior arts 1 through 4.
Figure 23B:
Figure 23C:
Figure 23D:
Figure 24A:
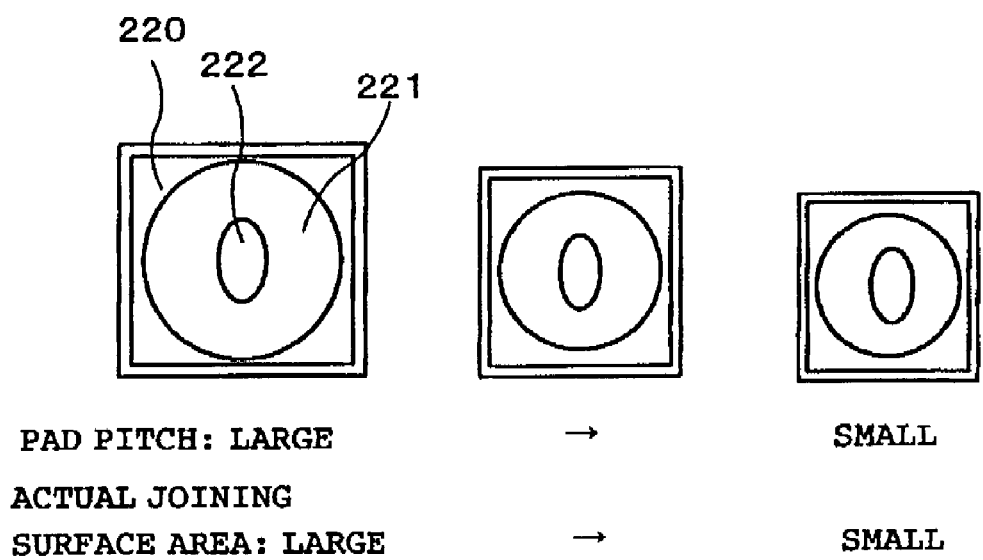
FIGS. 24A-24B are diagrams for describing other problems of the prior art.
Figure 24B:
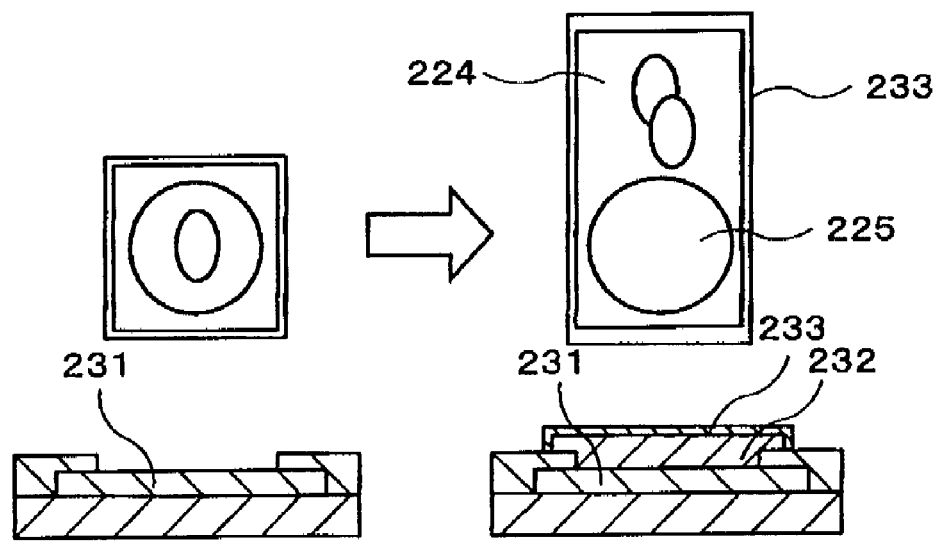

FIG. 10 is a cross-sectional view showing the semiconductor device testing apparatus according to a third embodiment of the present invention. The difference between the present embodiment and the first and second embodiments is that the number of probe pins of the power supply unit 20 is reduced by providing a shared power source layer 512 to the entire chip inside the wafer 511 in the tested LSI 50. The shared power source layer 512 is not shared over the entire wafer 511, and the wafer 511 can be divided into ⅛, ¼, or another fixed area and shared. In the present embodiment, a structure is also provided in which the power line can immediately be severed from other chips when a defective chip is produced. Such a structure allows other tested LSIs to be tested when a defective chip is produced during testing.

The power source electrodes that make contact with the probe pin 21 can be disposed on the scribe line between the chips or in the peripheral area of the wafer 511 by the placement of the shared power source layer 512 inside the wafer 511. Therefore, the position of the probe pin 21 of the power unit is made to correspond to the position of the power source electrodes 513 of the wafer 511, whereby the probe pin 21 can supply power to and test the tested LSI 50 without making contact with the power source electrodes on the tested LSI 50, and contact marks on all of the electrodes of the tested LSI 50, including the power source electrodes, can be eliminated. Therefore, the connection reliability after testing can be dramatically increased.

Fourth Embodiment

FIG. 11 is a cross-sectional view showing the semiconductor device testing apparatus according to a fourth embodiment of the present invention. The difference between the present embodiment and the first to third embodiments is that a high-density wiring substrate 60 and a dedicated testing LSI 70 are provided in place of the testing LSI.

The high-density wiring substrate 60 has electrodes in positions that correspond to the signal electrodes of the tested LSI 50 in place of the testing LSI, and signals are transmitted and received by capacitive coupling with the tested LSI 50 via the electrodes. The high-density wiring substrate 60 has a wiring layer and electrodes for transmitting the signals to the dedicated testing LSI 70. The external electrodes of the dedicated testing LSI 70 are connected to the electrodes of the high-density wiring substrate 60.

The present embodiment is advantageous in that through-electrodes do not need to be formed in the dedicated testing LSI 70 because the testing LSI is separated into the dedicated testing LSI 70 and the high-density wiring substrate 60 for performing capacitive coupling with the tested LSI 50. However, since testing signals pass through the wiring of the high-density wiring substrate 60, transmitted signals are lost and high-speed testing is adversely affected, making it necessary to properly use the first to third embodiments in accordance with testing details.

(Method for Manufacturing a Power Supply Unit)

Next, the method for manufacturing the power supply unit 20 in FIG. 1 will be described in detail with reference to FIGS. 12 and 15.

A glass ceramic, glass, or another insulation material having prescribed dimensions is prepared as the substrate 22 (FIG. 12(*a*)). Next, a countersunk part 321 is formed to a depth of 200 μm or more in an area obtained by adding the length of the probe pin to the position of the power source electrodes of the tested LSI in the substrate 22 (FIG. 12(*b*)). The external dimensions of the substrate 22 depend on the power source electrodes, the number of pins of an external IF, and the pitch of the penetrating electrodes 10A. For example, when the number of pins is 200 and the pitch of the penetrating electrodes 10A is 0.5 mm, the external shape of the substrate 22 is 27 mm. A high-power LD (Laser Diode) excitation-type YAG (Yttrium Aluminum Garnet) laser having a wavelength of 355 nm or RIE (Reactive Ion Etching) is thereafter used to form a through-hole 322 in an area having a diameter of 200 μm and a depth of 270 μm or more (FIG. 12(*c*)). Next, plasma CVD (Chemical Vapor Deposition) or sputtering is used to apply a copper seed layer 323 to the entire surface to a depth of 100 to 300 nm (FIG. 12(*d*)).

Next, the countersunk part 321 and the through-hole 322 are completely filled with the copper layer by electrolytic plating, as shown in FIG. 12(*e*), and a sacrificial layer 324 and a through-electrode 20B are formed. When the interior of the through-hole 322 is completely filled, a copper layer of several micrometers to several tens of micrometers is deposited on the surface as a matter of course. Therefore, the copper plating is completed, the copper layer deposited on the surface is thereafter removed, and a flat state is formed by CMP (Chemical Mechanical Polishing). A copper seed layer 326 is subsequently formed to a thickness of about 0.3 μm on the surface on which the sacrificial layer 324 and the penetrating electrodes 20B are exposed (FIG. 12(*f*)). A resist 327 is bonded or coated to a thickness of 20 μm on the surface of the seed layer 326 (FIG. 12(*g*)), and a concave shape is thereafter formed in which the resist of the portions that correspond to the probe pin and the first wiring layer are removed using photolithography, which entails exposure and development (FIG. 13(*h*)). The elastic first metal layer 24A and first wiring layer 23 are grown by electrolytic plating in the concave portion (FIG. 13(*i*)).

The resist and metal surface are subsequently polished to a uniform flat plane, the resist 328 is coated to a thickness of 40 μm on the polished surface (FIG. 13(*j*)), exposure and development is then carried out, and a concave portion 329 is formed in the area in which the metal protrusions are formed (FIG. 13(*k*)). Next, the first metal layer 24A is formed by plating on the concave portion 329. The process is repeated three times, whereby metal protrusions having a height of 100 μm or more can be obtained (FIG. 12(*l*)). The process of forming concave portions and applying plating is repeated (FIG. 13(*m*), 13(*n*), 14(*o*), and 14(*p*)) when the height H2 of the metal protrusions must be 100 μm or more, whereby the height can sequentially be built up. In this case, 330 is the seed layer in FIG. 13(*m*), and 331 is the resist in FIG. 13(*n*).

Next, the step of polishing the surface of the metal protrusions is carried out, and in this stage the processing method is varied in accordance with the contact object, i.e., the material of the power source electrodes of the tested semiconductor device. When the contact object is a gold electrode or a gold bump, CMP (Chemical Mechanical Polishing) is used to perform the polishing so as to assure a surface roughness on the level of 0.05 µm or less. When the contact object is an aluminum electrode or a copper electrode, concavities and convexities of 0.1 to 0.7 µm are provided to the surface layer of the metal protrusions after CMP processing has been completed.

An example of the method for forming concavities and convexities will be described. A #2000 lapping sheet (abrasive cloth) having very small metal particles is prepared. The cloth is moved about 50 cycles in the area from the distal end of the probe pin to a distance of 300 µm in the movement direction of the probe pin, whereby concavities and convexities of 0.1 to 0.7 µm are provided. As another method for forming concavities and convexities, it is also possible to use a ceramic material having suitable porosity or a silicon substrate in which suitable concavities and convexities are formed in advance. As shown in FIG. 6, the concave and convex shapes are not limited to the movement direction of the probe pin, and a direction perpendicular to the movement direction is also possible. It is also possible to adopt a grid shape, a diagonal shape, a file-tooth shape, a random shape, or any other of a variety of other shapes. The natural oxide film on the surface of the aluminum or copper can be broken and stable contact can be achieved by the use of minute concavities and convexities.

A seed layer 333 is then formed, a resist 332 is coated (FIG. 14($q$)), a concave portion is formed by exposure and development, and a second metal layer 24B is formed by plating to a thickness of 0.01 µm or more (FIG. 14($r$)). A more stable contact can be achieved because the effect of an oxide film on the Ni or Ni alloy acting as the first metal layer 24A can be eliminated.

When the step above has been completed, the back surface of the substrate is processed (FIG. 14($s$)). First, the thickness of the substrate 22 is reduced to about 250 µm by using a grinder, and dry etching is carried out as needed in order to remove the damaged layer. Next, a copper seed layer 334 is formed by sputtering to a thickness of about 0.3 µm on the entire back surface on which the penetrating electrode 20B is exposed (FIG. 14($t$)). A resist 335 is coated to a thickness of 20 µm on the surface, and the resist of the portion that corresponds to the second wiring layer 25 is removed by exposure and development to form a concave shape. Ni or an Ni alloy plating is formed by electrolytic plating to a thickness of 5 to 15 µm in the concave portion to produce a third wiring layer 27. Au or an Au alloy plating is then formed to a thickness of 0.01 µm or less by electroless plating on the surface (FIG. 14($u$)). The resist layer and seed layer on the back surface are removed by wet etching and milling, respectively, and the resist layer and seed layer on the front surface are removed by the same method (FIGS. 15($v$) to 15($y$)). Lastly, the sacrificial layer 324 is removed by wet etching (FIG. 15($z$)).

A power supply unit 20 can thus be obtained in a way wherein isolation is achieved between, first, a probe pin 21 whose distal end is provided with metal protrusions having a material and structure that possess good contact characteristics in accordance with the contact object, and, second, the second wiring layer 25 formed on the surface of the first wiring layer 23 and the second metal layer 24B of the surface of the metal protrusions are isolated (FIG. 15($zz$)).

As described in detail above, the semiconductor device testing apparatus according to the present invention has a testing LSI, a power supply unit, and an intermediate substrate that is provided so that there is a connection between the testing LSI, and the power supply unit and performance board, and that has a pitch expansion wiring layer. The testing LSI has a testing circuit, a waveform shaping (comparator) circuit, an electrode disposed in a position that corresponds to the signal electrode pad of a tested LSI, a penetrating electrode for power source driving and exterior interfacing, and a dielectric material formed on the surface facing the tested LSI. The power supply unit has mutually independent elastic probe pins that are disposed in positions that correspond to power electrodes of a tested semiconductor device, and a substrate that is electrically connected to the probe pins and on which a first wiring layer is formed. Also, metal protrusions composed of one or more metal layers for probing the power source electrodes of the tested LSI are formed on the distal ends of the probe pin. One or more metal layers composed of a material having good contact characteristics are formed on the surface of the metal protrusions in accordance with the electrode material of the tested LSI. A second wiring layer composed of one or more metal layers is formed on the first wiring layer, and the structure in one in which the one or more metal layers formed on the surface of the metal protrusions and the second wiring layer are isolated from each other.

In accordance with such a configuration, the power supply unit has mutually independent lead-shaped probe pins provided with metal protrusions in positions that correspond to the power source electrodes of the tested LSI. Therefore, the tested LSI can be brought into sufficiently close proximity to the testing LSI, and non-contact signal transmission can be carried out by capacitive coupling of the signal electrodes. The probe pin of the power supply unit has a metal layer that has good contact characteristics in accordance with the electrode material of the tested LSI, and that is disposed on the surface in contact with the power source electrodes of the tested LSI in the metal protrusions of the probe pin. Therefore, stable contact can be achieved with very low pressure. Accordingly, contact marks of the electrodes of the tested LSI are absent from the signal electrodes and can be considerably reduced on the power source electrodes.

A power supply having improved efficiency can be obtained via the structure of the power supply unit of the present invention because transmission loss can be reduced in the pathway through which the power current flows.

Also, the second metal layer provided to the metal protrusions at the distal end portion of the probe pins is gold or a gold alloy, whereby an increase in the contact resistance due to oxidation can be reduced. Gold or a gold alloy is a metal having relatively low resistance. Therefore, a high capacitance electric current can be allowed to flow in the power supply, and other considerable effects can be achieved.

As a result, the following effects are obtained.

1. The connection reliability after testing is dramatically increased.

2. A narrower pitch and lower costs due to a smaller chip size can be achieved because the shape of the electrodes of the tested LSI can be made rectangular to square.

3. Since signals are exchanged between the testing LSI and the tested LSI, the signal transmission distance can be made very short and high-speed testing that better approximates the level of actual operation is made possible in comparison with the conventional wiring distance from the tester to the probe pin.

4. The circuit surface of the testing LSI can be provided with an elastic dielectric material having a relatively high dielectric constant. Therefore, the margin related to the parallelism between the wafer stage of the wafer prober and the testing apparatus of the present invention can be increased.

The semiconductor device testing apparatus of the present invention can provide a highly reliable connection in a subsequent connection process, narrow the pitch of a device, and dramatically reduce costs by eliminating contact marks on the electrodes of a tested LSI. High-speed testing can be carried out in comparison with conventional testing by using a testing LSI, and selective testing at the same level as a packaged product can be performed with the semiconductor device in a bare chip state. Therefore, the production yield rate for a Sip structure in which a bare chip is used can be increased and manufacturing costs can be considerably reduced.

INDUSTRIAL APPLICABILITY

The present invention can be suitably applied to semiconductor device testing.

The invention claimed is:

1. A semiconductor device testing apparatus comprising:
a testing LSI;
a power supply unit; and
an intermediate substrate provided so that there is a connection between said testing LSI, and said power supply unit and tester;
said testing LSI having a wafer, a dielectric material layer disposed on said wafer at a surface side of said wafer which faces a tested semiconductor device, an electrode disposed in said dielectric material layer at a position facing an external terminal electrode of said tested semiconductor device on a surface of said wafer which faces said tested semiconductor device, and a first penetrating electrode that passes completely through said wafer, is connected to said electrode, and is used for exchanging signals with the exterior; and
said power supply unit having mutually independent elastic probe pins that are disposed in positions that correspond to power electrodes of said tested semiconductor device, and that are provided with a metal protrusion at the distal ends thereof, a substrate on which a first wiring layer is formed, and is electrically connected to the probe pins, and a second penetrating electrode that passes through the substrate.

2. The semiconductor device testing apparatus according to claim 1, wherein said metal protrusion in said probe pins is composed of one or more metal layers, and has a structure in which one or more metal layers composed of a material having good contact characteristics are formed on the surface of said metal protrusion in accordance with the material of said power electrodes of said tested semiconductor device, a second wiring layer composed of one or more metal layers is formed on said first wiring layer, and said one or more metal layers formed on the surface of said metal protrusion and said second wiring layer are isolated.

3. The semiconductor device testing apparatus according to claim 1, wherein said dielectric material layer is formed from a material having a high relative dielectric constant and elasticity.

4. The semiconductor device testing apparatus according to claim 2, wherein the volume resistivity of said second wiring layer is less than the volume resistivity of said first wiring layer.

5. The semiconductor device testing apparatus according to claim 2, wherein a third metal layer composed of one or more metal layers is disposed between said first wiring layer and said substrate in said power supply unit.

6. The semiconductor device testing apparatus according to claim 5, wherein the volume resistivity of said third metal layer is less than the volume resistivity of said first wiring layer.

7. The semiconductor device testing apparatus according to claim 1, wherein:
the shape of said metal protrusion is a prismatic shape in which the surface facing said tested semiconductor device has a rectangular shape;
the width thereof is the width of said probe pin or less;
the length thereof is equal to or greater than a dimension obtained by adding the movement distance of the distal portion of said probe pin after said probe pin has made contact with the power source electrode of said semiconductor device, as well as the length that takes into consideration the positional tolerance of said probe pin in the lengthwise direction and the dimensional tolerance of the power source electrode of said semiconductor device;
and the height thereof is equal to or greater than a dimension obtained by, the surface of the first wiring layer being used as a reference, adding an indentation distance after the power source electrode of said tested semiconductor device has made contact with said metal protrusion, as well as the height that takes into consideration the height tolerance of said metal protrusion and the height tolerance of the power source electrode of said tested semiconductor device.

8. The semiconductor device testing apparatus according to claim 2, wherein said one or more metal layers formed on the surface of said metal protrusion are gold or gold alloy layers.

9. The semiconductor device testing apparatus according to claim 2, wherein said one or more metal layers formed on the surface of said metal protrusion have minute concavo-convex shapes on the surface thereof.

10. The semiconductor device testing apparatus according to claim 9, wherein said minute concavo-convex shapes are shapes in which concavities and convexities are formed in the shape of stripes and in which the stripes extend in the same direction as the movement direction of said probe pin, shapes in which concavities and convexities are formed in the shape of stripes and in which the stripes extend in a direction perpendicular to the movement direction of said probe pin, grid shapes, file-tooth shapes, or random shapes.

11. The semiconductor device testing apparatus according to claim 9, wherein said minute concavo-convex shapes are minute concavo-convex shapes having a surface roughness of 1 μm or less.

12. A power supply unit for a semiconductor device testing apparatus, comprising:
mutually independent elastic probe pins that are disposed in positions that correspond to power electrodes of a tested semiconductor device, and that are provided with a metal protrusion at the distal ends thereof;
a substrate on which a first wiring layer is formed, and is electrically connected to the probe pins; and
a penetrating electrode that passes through the substrate,
wherein said metal protrusion in said probe pins is composed of one or more metal layers, and has a structure in which one or more metal layers composed of a material having good contact characteristics are formed on the surface of said metal protrusion in accordance with the material of said power electrodes of said tested semiconductor device, a second wiring layer composed of said one or more metal layers is formed on said first wiring layer, and said one or more metal layers formed on the surface of said metal protrusion and said second wiring layer are isolated.

13. The power supply unit according to claim 12, wherein the volume resistivity of said second wiring layer is less than the volume resistivity of said first wiring layer.

14. The power supply unit according to claim 12, wherein a third metal layer composed of one or more metal layers is formed between said first wiring layer and said substrate.

15. The power supply unit according to claim 14, wherein the volume resistivity of said third metal layer is less than the volume resistivity of said first wiring layer.

* * * * *

UNITED STATES PATENT AND TRADEMARK OFFICE
CERTIFICATE OF CORRECTION

PATENT NO. : 7,852,101 B2  
APPLICATION NO. : 12/066009  
DATED : December 14, 2010  
INVENTOR(S) : Michinobu Tanioka, Shigeki Hoshino and Toru Taura Page 1 of 1

It is certified that error appears in the above-identified patent and that said Letters Patent is hereby corrected as shown below:

Column 2, Line 57: delete "dampers" and insert -- clampers --

Column 3, Line 7: delete "damper" and insert -- clamper --

Column 3, Line 9: delete "damper" and insert -- clamper --

Column 3, Line 13: delete "damper" and insert -- clamper --

Column 3, Line 17: delete "damper" and insert -- clamper --

Column 10, Line 22: delete "are a" and insert -- are --

Column 10, Line 54: delete "12A-2G are a" and insert -- 12A-12G are --

Column 16, Line 60: delete "3S" and insert -- 35 --

Signed and Sealed this  
Twenty-seventh Day of December, 2011

David J. Kappos  
*Director of the United States Patent and Trademark Office*